(12) United States Patent
Kim et al.

(10) Patent No.: US 12,557,462 B2
(45) Date of Patent: Feb. 17, 2026

(54) DISPLAY DEVICE AND METHOD FOR MANUFACTURING THE SAME

(71) Applicant: Samsung Display Co., LTD., Yongin-si (KR)

(72) Inventors: Geun Tak Kim, Hwaseong-si (KR); Sung Ho Park, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 611 days.

(21) Appl. No.: 17/977,065

(22) Filed: Oct. 31, 2022

(65) Prior Publication Data

US 2023/0327049 A1    Oct. 12, 2023

(30) Foreign Application Priority Data

Apr. 6, 2022  (KR) .................. 10-2022-0042830

(51) Int. Cl.
| | | |
|---|---|---|
| *H10H 29/14* | (2025.01) | |
| *H10H 29/03* | (2025.01) | |
| *H10H 29/30* | (2025.01) | |
| *H10H 29/37* | (2025.01) | |
| *H10H 29/80* | (2025.01) | |
| *H10H 29/41* | (2025.01) | |

(52) U.S. Cl.
CPC .......... *H10H 29/142* (2025.01); *H10H 29/03* (2025.01); *H10H 29/30* (2025.01); *H10H 29/37* (2025.01); *H10H 29/8321* (2025.01); *H10H 29/41* (2025.01)

(58) Field of Classification Search
CPC ........ H10N 50/10; H10N 50/80; H10B 61/00; H10H 29/03; H10H 29/37; H10H 29/142; H10H 29/30; H10H 29/8321; H10H 29/41

See application file for complete search history.

(56) References Cited

U.S. PATENT DOCUMENTS

| | | | | |
|---|---|---|---|---|
| 2020/0403029 | A1* | 12/2020 | Kim | .................... H01L 25/0753 |
| 2021/0332493 | A1* | 10/2021 | Zhao | ........................ H05K 3/24 |
| 2022/0059628 | A1* | 2/2022 | Park | .................... H10K 59/353 |
| 2022/0254753 | A1* | 8/2022 | Lee | ......................... B41M 3/006 |
| 2025/0029968 | A1* | 1/2025 | Choi | .................. H10H 29/0364 |

FOREIGN PATENT DOCUMENTS

| | | | |
|---|---|---|---|
| KR | 10-2019-0029831 | 3/2019 | |
| KR | 10-2021-0103602 | 8/2021 | |
| WO | WO-2021020714 A1 * | 2/2021 | ............ B41M 3/006 |

\* cited by examiner

*Primary Examiner* — Ratisha Mehta
*Assistant Examiner* — Brad A Knudson
(74) *Attorney, Agent, or Firm* — Womble Bond Dickinson (US) LLP

(57) ABSTRACT

A display device comprises a light emitting area and a sub-area spaced apart from each other a first electrode and a second electrode disposed on a substrate and spaced apart from each other, a first insulating layer disposed on the first electrode and the second electrode, a bank layer disposed on the first insulating layer and disposed between the light emitting area and the sub-area, light emitting elements disposed on the first electrode and the second electrode, a first connection electrode electrically connected to an end of the light emitting element and a second connection electrode connected to another end of the light emitting element, and auxiliary electrodes disposed between the substrate and the bank layer and spaced apart from each other with the light emitting area and the sub-area disposed between the auxiliary electrodes.

21 Claims, 15 Drawing Sheets

DISPLAY DEVICE AND METHOD FOR MANUFACTURING THE SAME

CROSS-REFERENCE TO RELATED APPLICATION

This application claims priority to and benefits of Korean Patent Application No. 10-2022-0042830 under 35 U.S.C. § 119, filed on Apr. 6, 2022 in the Korean Intellectual Property Office (KIPO), the entire contents of which are incorporated herein by reference.

BACKGROUND

1. Technical Field

The disclosure relates to a display device and a method for manufacturing the same.

2. Description of the Related Art

The importance of a display device is increasing with the development of multimedia. Accordingly, various types of display devices such as an organic light emitting display (OLED) and a liquid crystal display (LCD) are being used.

The display device includes a display panel such as an organic light emitting display panel or a liquid crystal display panel as a device for displaying an image of the display device. The display device may include a light emitting element as the light emitting display panel among the display panels. For example, a light emitting diode (LED) includes an organic light emitting diode that uses an organic material as a light emitting material, an inorganic light emitting diode that uses an inorganic material as a light emitting material, and the like.

SUMMARY

Aspects of the disclosure provide a display device capable of improving luminance of sub-pixels by moving and aligning non-emitting light emitting elements to emit light, and a method for manufacturing the same.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device comprises a light emitting aera and a sub-area spaced apart from the light emitting area, a first electrode and a second electrode disposed on a substrate and spaced apart from each other, a first insulating layer disposed on the first electrode and the second electrode, a bank layer disposed on the first insulating layer and disposed between the light emitting area and the sub-area, light emitting elements disposed on the first electrode and the second electrode, a first connection electrode electrically connected to an end of the light emitting element and a second connection electrode connected to another end of the light emitting element, and auxiliary electrodes disposed between the substrate and the bank layer and spaced apart from each other with the light emitting area and the sub-area disposed between the auxiliary electrodes.

In an embodiment, the auxiliary electrodes may overlap the bank layer in a plan view and do not overlap the light emitting area and the sub-area in a plan view.

In an embodiment, the auxiliary electrodes may extend parallel to the first electrode and the second electrode and are spaced apart from the first electrode and the second electrode.

In an embodiment, the display device may further comprise first bank patterns disposed between the substrate and the bank layer, wherein the auxiliary electrodes are disposed between the first bank patterns and the substrate.

In an embodiment, the auxiliary electrodes may be covered by the first bank patterns.

In an embodiment, the auxiliary electrodes may include a first auxiliary electrode and a second auxiliary electrode spaced apart from each other, and the first auxiliary electrode and the second auxiliary electrode may be spaced apart from each other with the light emitting area disposed between the first and second auxiliary electrodes.

In an embodiment, the first auxiliary electrode may include a first auxiliary extension portion extending parallel to the first electrode, a first branch portion branched from the first auxiliary extension portion in a first direction, and a second branch portion and a third branch portion branched from the first auxiliary extension portion in a direction opposite to the first direction, the second and third branch portions spaced apart from each other, and the second auxiliary electrode may include a second auxiliary extension portion extending parallel to the first electrode, a fourth branch portion branched from the second auxiliary extension portion in the first direction, and a fifth branch portion and a sixth branch portion branched from the second auxiliary extension portion in the direction opposite to the first direction, the fifth and sixth branch portions spaced apart from each other.

In an embodiment, the first branch portion, the fifth branch portion, and the sixth branch portion may extend to the light emitting area disposed between the first auxiliary electrode and the second auxiliary electrode, and the fifth branch portion and the sixth branch portion may be spaced apart from each other with the first branch portion disposed between the fifth and sixth branch portions.

In an embodiment, the second branch portion and the third branch portion may extend from the light emitting area to another light emitting area adjacent in the direction opposite to the first direction, and the fourth branch portion may extend from the light emitting area to another light emitting area adjacent in the first direction.

In an embodiment, the first branch portion may not overlap the first electrode and the second electrode in a plan view, and the fifth branch portion may overlap the first electrode and the second electrode in a plan view.

In an embodiment, the display device may further comprise a first via layer disposed on the substrate, a second via layer disposed on the first via layer, and first bank patterns disposed on the second via layer and spaced apart from each other.

In an embodiment, the first auxiliary electrode and the second auxiliary electrode may be disposed between the first via layer and the second via layer, and the first electrode and the second electrode may be disposed on the second via layer.

In an embodiment, the first branch portion may not overlap the first bank patterns in a plan view, and the fifth branch portion and the sixth branch portion may overlap the first bank patterns in a plan view.

In an embodiment, the first auxiliary electrode and the second auxiliary electrode may have a substantially same shape in a plan view.

In an embodiment, the first branch portion, the fifth branch portion, and the sixth branch portion may overlap the light emitting area and do not overlap the light emitting elements in a plan view.

According to an embodiment of the disclosure, a method for manufacturing a display device, the method comprises preparing, on a substrate, auxiliary electrodes spaced apart from each other, first and second electrodes spaced apart from each other, and a bank layer disposed on the auxiliary electrodes are formed, providing light emitting element ink including light emitting elements onto the substrate, applying an alternating current (AC) signal to the auxiliary electrodes, and aligning the light emitting elements by applying an alignment signal to the first electrode and the second electrode.

In an embodiment, the AC signal applied to the auxiliary electrodes may be a signal of about 50 Hz or less.

In an embodiment, in case that the AC signal is applied to the auxiliary electrodes, a flow of the light emitting element ink may be generated by an AC electroosmosis phenomenon.

In an embodiment, the method may further comprise performing a drying process of drying the light emitting element ink and the applying of the AC signal to the auxiliary electrodes at a substantially same time.

In an embodiment, the method may further comprise performing a drying process of drying and removing the light emitting element ink after the light emitting elements are aligned.

According to the display device and the method for manufacturing the same according to embodiments, the luminance of the sub-pixels may be improved by moving the light emitting elements to the light emitting area and disposing the light emitting elements on the electrodes to increase the number of light emitting elements that emit light.

However, the effects of the embodiments are not restricted to the one set forth herein. The above and other effects of the embodiments will become more apparent to one of daily skill in the art to which the embodiments pertain by referencing the claims.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
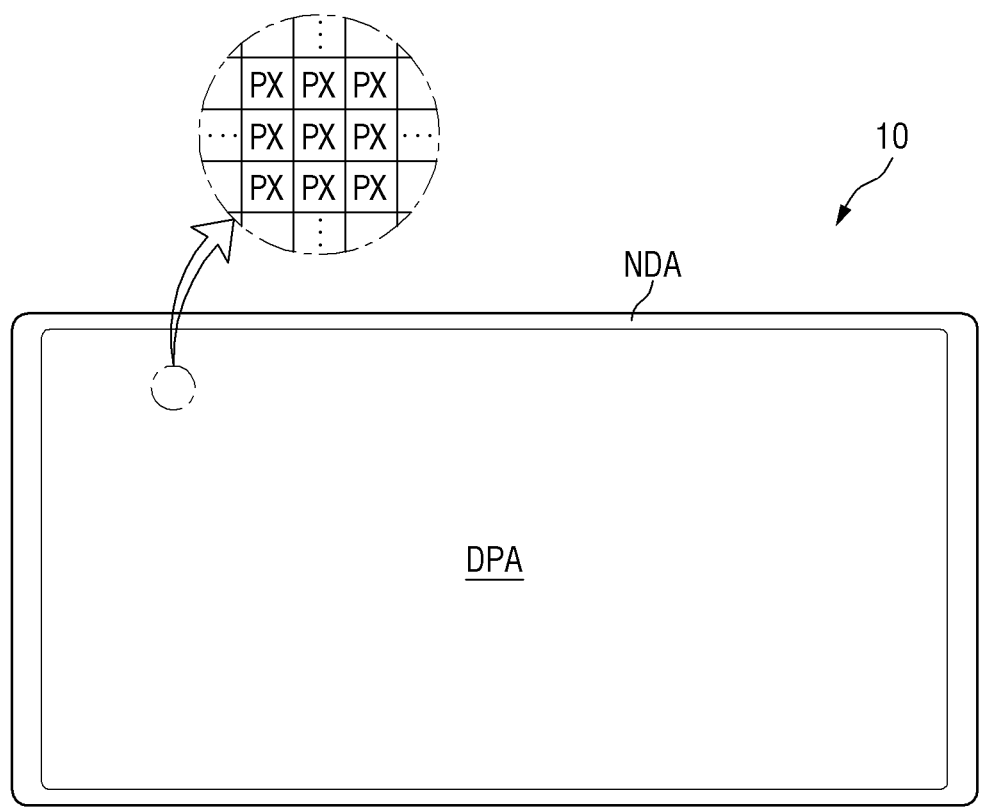
FIG. 1 is a schematic plan view of a display device according to an embodiment.
Figure 1:
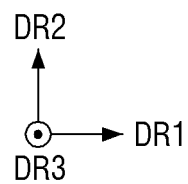

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be more thorough and complete, and will convey the scope of the disclosure to those skilled in the art.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving are possible. Each embodiment may be implemented independently of each other or may be implemented together in an association.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, specific embodiments will be described with reference to the accompanying drawings.

FIG. 1 is a schematic plan view of a display device according to an embodiment.

Referring to FIG. 1, a display device 10 displays a moving image or a still image. The display device 10 may refer to all electronic devices that provide display screens. For example, the display device 10 may include televisions, laptop computers, monitors, billboards, Internet of things (IoT) devices, mobile phones, smartphones, tablet personal computers (PCs), electronic watches, smartwatches, watch phones, head-mounted displays, mobile communication terminals, electronic organizers, e-book readers, portable multimedia players (PMI's), navigation devices, game machines, digital cameras, camcorders, and the like, that provide display screens.

The display device 10 includes a display panel providing a display screen. Examples of the display panel may include an inorganic light emitting diode display panel, an organic light emitting display panel, a quantum dot light emitting display panel, a plasma display panel, a field emission display panel, and the like. Hereinafter, a case in which the inorganic light emitting diode display panel is applied as an example of the display panel will be described by way of example, but the disclosure is not limited thereto, and the same/similar technical ideas may be applied to other display panels if applicable.

Hereinafter, a first direction DR1, a second direction DR2, and a third direction DR3 are defined in the drawings for describing the display device 10. The first direction DR1 and the second direction DR2 may be directions perpendicular to each other in a plane. The third direction DR3 may be a direction perpendicular to the plane in which the first direction DR1 and the second direction DR2 are positioned. The third direction DR3 is perpendicular to each of the first direction DR1 and the second direction DR2. In embodiments for describing the display device 10, the third direction DR3 refers to a thickness direction of the display device 10.

A shape of the display device 10 may be variously changed. For example, the display device 10 may have a rectangular shape including a side which is longer in the first direction DR1 than in the second direction DR2 in a plan view. As another example, the display device 10 may have a rectangular shape including a side which is longer in the second direction DR2 than in the first direction DR1 in a plan view. However, the shape of the display device 10 is not limited thereto, and the display device 10 may also have a square shape, a quadrangle with rounded corner portions (vertices), other polygonal shapes, or a circular shape. A shape of a display area DPA of the display device 10 may also be similar to an overall shape of the display device 10. FIG. 1 illustrates, as example, the display device 10 and the display area DPA having a rectangular shape which is longer in the first direction DR1 than in the second direction DR2 are illustrated.

The display device 10 may include a display area DPA and a non-display area NDA. The display area DPA is an area in which an image may be displayed, and the non-display area NDA is an area in which no image is displayed. The display area DPA may also be referred to as an active area, and the non-display area NDA may also be referred to as a non-active area. The display area DPA may substantially occupy the center of the display device 10.

The display area DPA may include pixels PX. The pixels PX may be arranged in a matrix direction. A shape of each pixel PX may be a rectangular shape or a square shape in a plan view, but is not limited thereto, and may also be a rhombic shape of which each side is inclined with respect to a direction. Each pixel PX may be alternately arranged in a stripe type or a PENTILE™ type. Each of the pixels PX may include one or more light emitting elements that emit light of a specific wavelength band to display a specific color.

The non-display area NDA may be disposed around the display area DPA. The non-display area NDA may completely or partially surround the display area DPA. The display area DPA may have a rectangular shape, and the non-display area NDA may be disposed adjacent to four sides of the display area DPA. The non-display area NDA may constitute a bezel of the display device 10. Lines or circuit drivers included in the display device 10 may be disposed, or external devices may be mounted thereon, in each of the non-display areas NDA.

Figure 2:
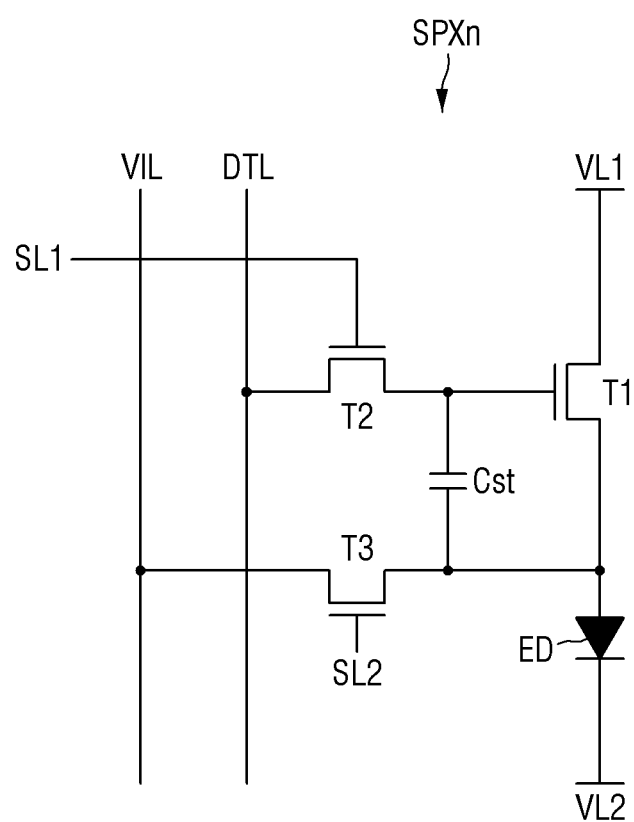
FIG. 2 is a schematic diagram of an equivalent circuit of a sub-pixel of the display device according to an embodiment.

FIG. 2 is a schematic diagram of an equivalent circuit of a sub-pixel of the display device according to an embodiment.

Referring to FIG. 2, each sub-pixel SPXn of the display device 10 according to an embodiment includes three transistors T1, T2, and T3 and a storage capacitor Cst, in addition to a light emitting diode (or light emitting element) ED.

The light emitting element ED may emit light according to a current supplied through a first transistor T1. The light emitting element ED may emit light of a specific wavelength band by electrical signals transmitted from a first electrode and a second electrode electrically connected to ends thereof.

An end of the light emitting element ED may be electrically connected to a source electrode of the first transistor T1, and another end of the light emitting element ED may be electrically connected to a second voltage line VL2 to which a low potential voltage (hereinafter, referred to as a second power voltage) lower than a high potential voltage (hereinafter, referred to as a first power voltage) of a first voltage line VL1 is supplied.

The first transistor T1 adjusts a current flowing from the first voltage line VL1, to which the first power voltage is supplied, to the light emitting element ED according to a voltage difference between a gate electrode and the source electrode thereof. As an example, the first transistor T1 may be a driving transistor for driving the light emitting element ED. The gate electrode of the first transistor T1 may be electrically connected to a source electrode of a second transistor T2, and the source electrode of the first transistor T1 may be electrically connected to an end of the light emitting element ED. A drain electrode of the first transistor T1 may be electrically connected to the first voltage line VL1 to which the first power voltage is applied.

The second transistor T2 is turned on by a scan signal of a first scan line SL1 to connect a data line DTL to the gate electrode of the first transistor T1. A gate electrode of the second transistor T2 may be electrically connected to the first scan line SL1, the source electrode of the second transistor T2 may be electrically connected to the gate electrode of the first transistor T1, and a drain electrode of the second transistor T2 may be electrically connected to the data line DTL.

A third transistor T3 is turned on by a scan signal of a second scan line SL2 to connect an initialization voltage line VIL to an end of the light emitting element ED. A gate electrode of the third transistor T3 may be electrically connected to the second scan line SL2, a drain electrode of the third transistor T3 may be electrically connected to the initialization voltage line VIL, and a source electrode of the third transistor T3 may be electrically connected to an end of the light emitting element ED or the source electrode of the first transistor T1. Although the first scan line SL1 and the second scan line SL2 are separately illustrated in the drawing, the disclosure is not limited thereto. In some embodiments, the first scan line SL1 and the second scan line SL2 may be formed as a single line. The second transistor T2 and the third transistor T3 may be simultaneously turned on by a same scan signal.

In an embodiment, the source electrode and the drain electrode of each of the transistors T1, T2, and T3 are not limited to those described above, and vice versa. Each of the transistors T1, T2, and T3 may be formed as a thin film transistor. It is mainly illustrated in FIG. 2 that each of the transistors T1, T2, and T3 is formed as an N-type metal oxide semiconductor field effect transistor (MOSFET), but the disclosure is not limited thereto. For example, each of the transistors T1, T2, and T3 may be formed as a P-type MOSFET, or some of the transistors T1, T2, and T3 may be formed as an N-type MOSFET and others of the transistors T1, T2, and T3 may be formed as a P-type MOSFET.

The storage capacitor Cst is formed between the gate electrode and the source electrode of the first transistor T1. The storage capacitor Cst stores a difference voltage between a gate voltage and a source voltage of the first transistor T1.

Hereinafter, a structure of a pixel PX of the display device 10 according to an embodiment will be described in detail with reference to other drawings.

Figure 3:
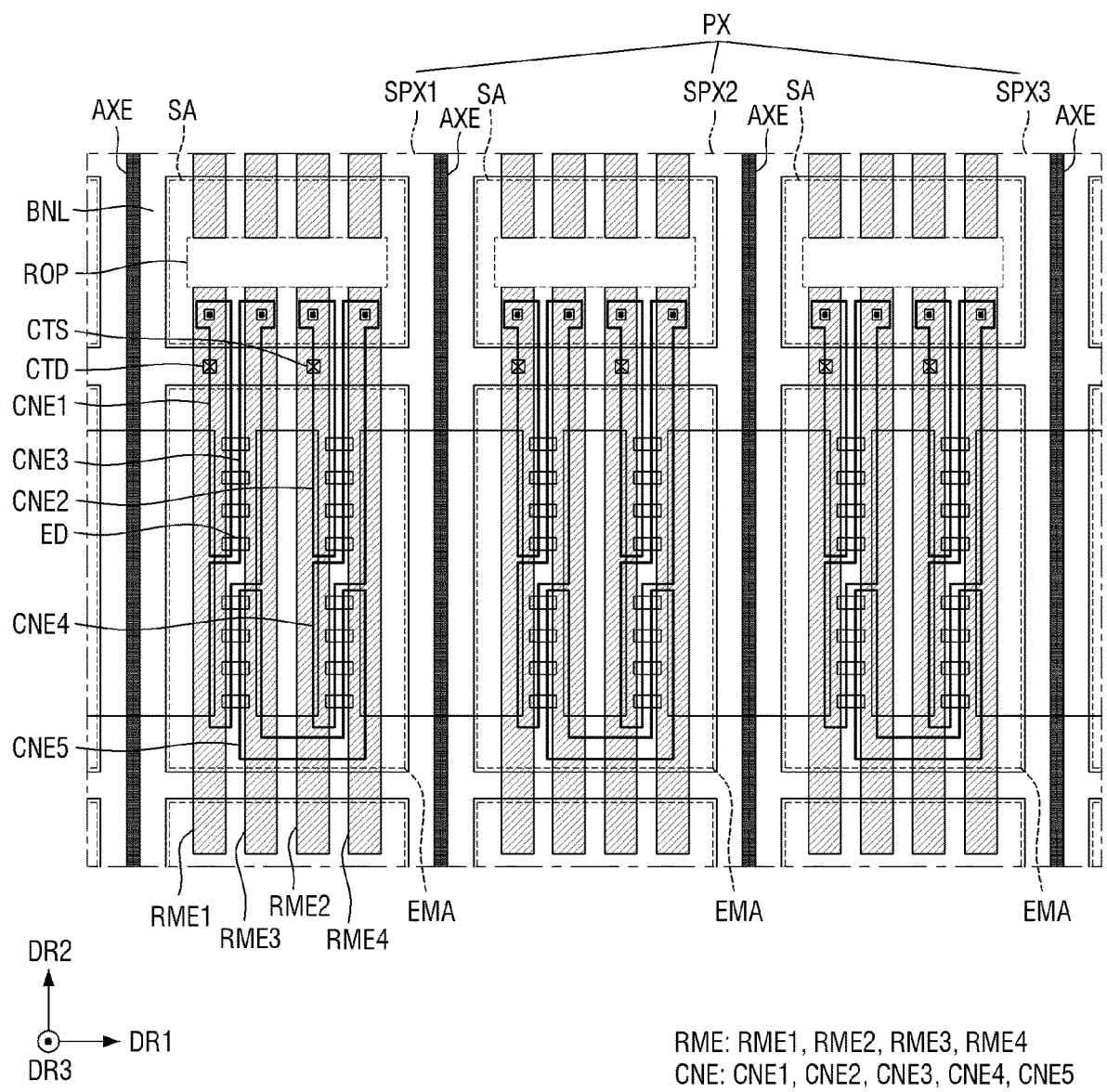
FIG. 3 is a schematic plan view illustrating a pixel of the display device according to an embodiment.

FIG. 3 is a schematic plan view illustrating a pixel of the display device according to an embodiment.

Referring to FIG. 3, each of pixels PX of the display device 10 may include sub-pixels SPXn (where n is 1 to 3). For example, a pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. As an example, the first color may be red, the second color may be green, and the third color may be blue. However, the disclosure is not limited thereto, and each of the sub-pixels SPXn may emit light of a same color. In another embodiment, each of the sub-pixels SPXn may emit blue light. FIG. 3 illustrates that a pixel PX includes three sub-pixels SPXn, but the disclosure is not limited thereto, and the pixel PX may include a larger number of sub-pixels SPXn.

Each of the sub-pixels SPXn of the display device 10 may include a light emitting area EMA and a non-light emitting area. The light emitting area EMA may be an area in which the light emitting elements ED are disposed and light of a specific wavelength band is emitted, and the non-light emitting area may be an area in which the light emitting elements ED are not disposed and light emitted from the light emitting elements ED does not reach, and thus light is not emitted. The light emitting area EMA may include an area in which the light emitting elements ED are disposed and an area which is adjacent to the light emitting elements ED and from which light emitted from the light emitting elements ED is emitted.

However, the disclosure is not limited thereto, and the light emitting area EMA may also include an area in which the light emitted from the light emitting elements ED is reflected or refracted by other members and then emitted. The light emitting elements ED may be disposed in each sub-pixel SPXn, and the light emitting area EMA including the area in which the light emitting elements ED are disposed and the area adjacent to the light emitting elements ED may be formed.

FIG. 3 illustrates that the light emitting area EMA of each sub-pixel SPXn has a substantially uniform area, but the disclosure is not limited thereto. In some embodiments, each of the light emitting areas EMA of each sub-pixel SPXn may also have a different area according to a color or wavelength band of light emitted from the light emitting element ED disposed in the corresponding sub-pixel.

Each sub-pixel SPXn may further include a sub-area SA disposed in the non-light emitting area. The sub-area SA may be disposed in the second direction DR2 of the light emitting area EMA and may be disposed between the light emitting areas EMA of the sub-pixels SPXn adjacent to each other in the second direction DR2. For example, the light emitting areas EMA and sub-areas SA may be repeatedly arranged in the second direction DR2, and the light emitting area EMA and sub-area SA may be alternately arranged. However, the disclosure is not limited thereto, and in the pixels PX, the light emitting areas EMA and the sub-areas SA may have a different arrangement from that of FIG. 3. In a pixel PX illustrated in FIG. 3, the light emitting area EMA and the sub-area SA disposed on an upper side of the light emitting area EMA in the second direction DR2 may be included in a sub-pixel SPXn, and a portion of the light emitting area EMA disposed in a direction opposite to the second direction DR2 may be a sub-area SA of another sub-pixel SPXn.

A bank layer BNL may be disposed between the sub-areas SA and the light emitting area EMA, and a gap between the sub-areas SA and the light emitting areas EMA may vary depending on a width of the bank layer BNL. Since the light emitting element ED is not disposed in the sub-area SA, light is not emitted from the sub-area SA, but some of electrodes RME1, RME2, and RME3 disposed in each sub-pixel SPXn may be disposed in the sub-area SA. Some of the electrodes RME disposed in different sub-pixels SPXn may be disposed to be isolated from each other by an isolation portion ROP (e.g., a first isolation portion ROP1) of the sub-area SA.

The bank layer BNL may be disposed in a lattice-shaped pattern on an entire surface of the display area DPA, including portions extending in the first and second directions DR1 and DR2 in a plan view. The bank layer BNL may be disposed across boundaries between the respective sub-pixels SPXn to distinguish the sub-pixels SPXn adjacent to each other. The bank layer BNL is disposed to surround the light emitting area EMA disposed in each sub-pixel SPXn to distinguish the light emitting areas EMA.

The display device 10 may include electrodes RME (RME1, RME2, RME3, and RME4), bank patterns BP1 and BP2, light emitting elements ED (ED1, ED2, ED3, and ED4), and connection electrodes CNE (CNE1, CNE2, CNE3, CNE4, and CNE5). An example configuration thereof will be described below.

Figure 4:
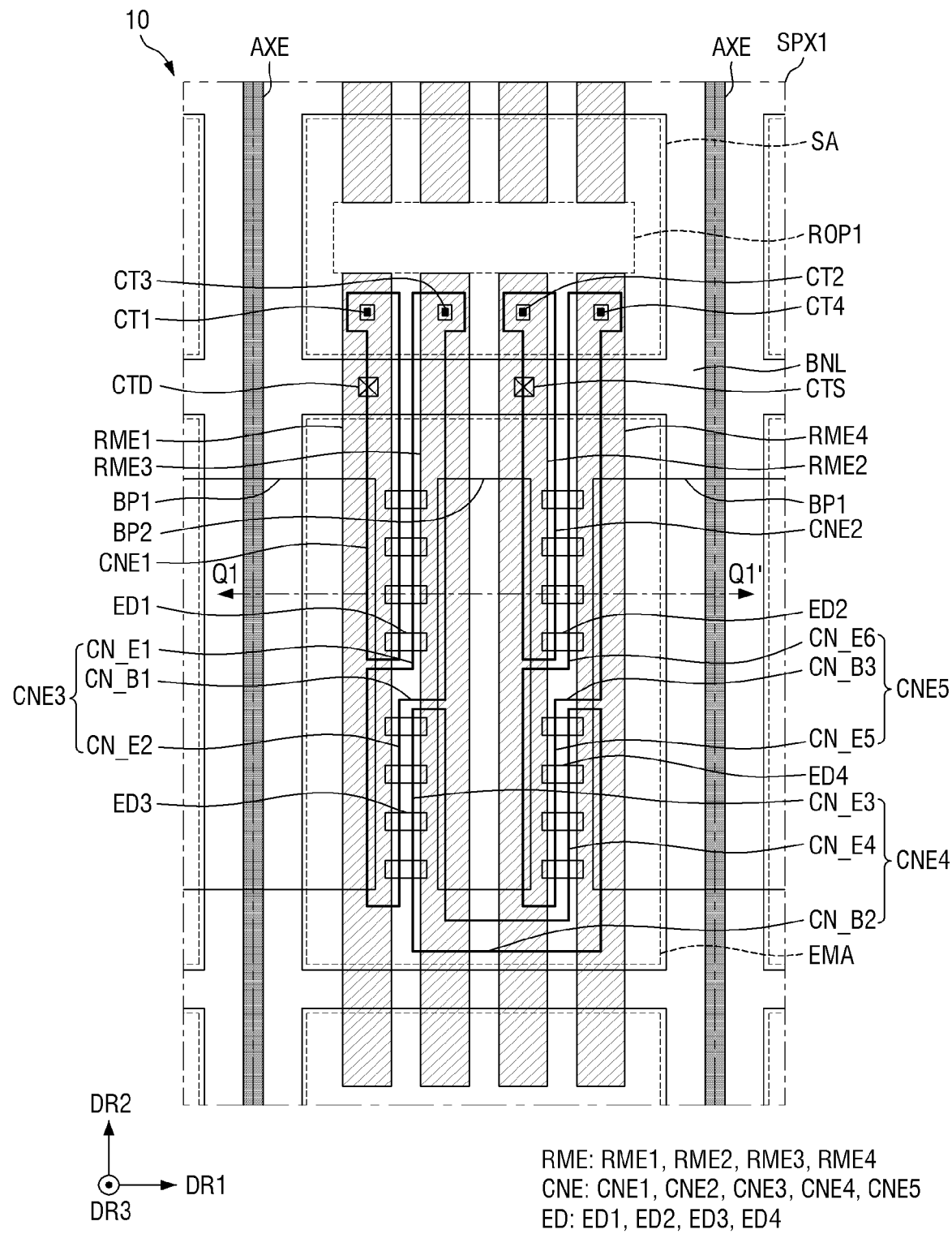
FIG. 4 is a schematic plan view illustrating a first sub-pixel of FIG. 3.
Figure 5:
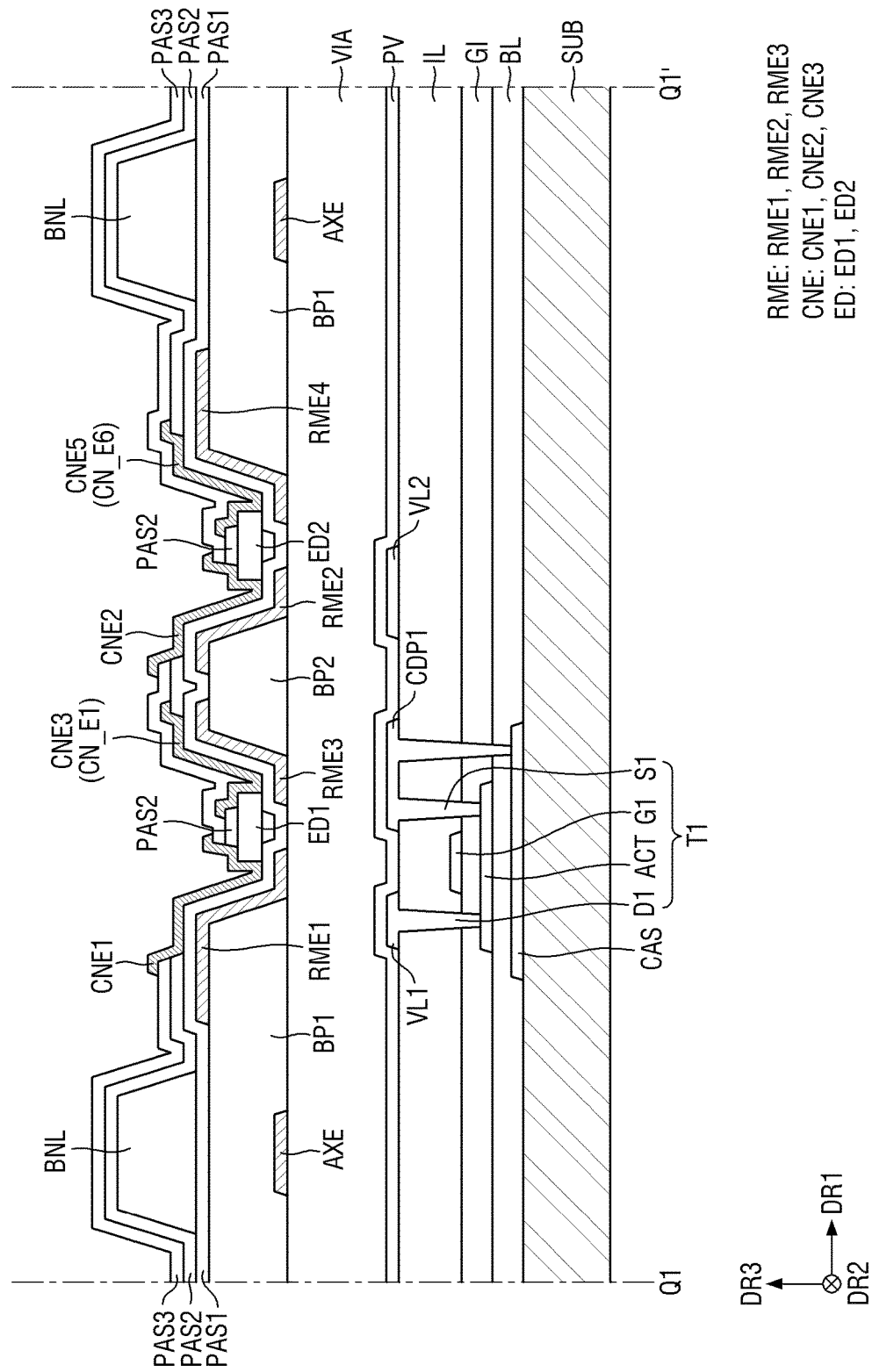
FIG. 5 is a schematic cross-sectional view taken along line Q1-Q1' of FIG. 4.

FIG. 4 is a schematic plan view illustrating a first sub-pixel of FIG. 3. FIG. 5 is a schematic cross-sectional view taken along line Q1-Q1' of FIG. 4.

Referring to FIGS. 4 and 5, the display device 10 may include a substrate SUB, and a semiconductor layer, conductive layers, and insulating layers disposed on the substrate SUB. Each of the semiconductor layer, the conductive layers, and the insulating layers may constitute (or form) a circuit layer and a display element layer of the display device 10.

The substrate SUB may be an insulating substrate. The substrate SUB may be made of (or include) an insulating material such as glass, quartz, or a polymer resin. The substrate SUB may be a rigid substrate, but may also be a flexible substrate that may be bent, folded, and/or rolled.

A first conductive layer may be disposed on the substrate SUB. The first conductive layer may include a lower metal layer CAS, and the lower metal layer CAS may be disposed to overlap (e.g., in a direction or view) an active layer ACT of the first transistor T1. The lower metal layer CAS may include a material of blocking light to prevent the light from being incident on the active layer ACT of the first transistor. However, the lower metal layer CAS may be omitted.

A buffer layer BL may be disposed on the lower metal layer CAS and the substrate SUB. The buffer layer BL may be formed on the substrate SUB to protect the transistors from moisture permeating through the substrate SUB which is vulnerable to moisture permeation, and may perform a surface planarization function.

The semiconductor layer may be disposed on the buffer layer BL. The semiconductor layer may include the active layer ACT of the first transistor T1. The active layer ACT may be disposed to partially overlap a gate electrode G1 of a second conductive layer to be described below.

The semiconductor layer may include polycrystalline silicon, single crystal silicon, an oxide semiconductor, or the like. In another embodiment, the semiconductor layer may also include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

FIG. 5 illustrates that a first transistor T1 is disposed in the sub-pixel SPXn of the display device 10, but the disclosure is not limited thereto and the display device 10 may include a larger number of transistors.

A gate insulating layer GI may be disposed on the active layer ACT. The gate insulating layer GI may serve (or function) as a gate insulating film of the first transistor T1.

A second conductive layer may be disposed on the gate insulating layer GI. The second conductive layer may include a gate electrode G1 of the first transistor T1. The gate electrode G1 may be disposed to overlap a channel area of the active layer ACT in a third direction DR3, which is a thickness direction.

An interlayer insulating layer IL may be disposed on the second conductive layer. The interlayer insulating layer IL may perform a function of an insulating film between the second conductive layer and other layers disposed thereon, and may protect the second conductive layer.

A third conductive layer may be disposed on the interlayer insulating layer IL. The third conductive layer may include a first voltage line VL1, a second voltage line VL2, and a first conductive pattern CDP1.

A high potential voltage (or a first power voltage) transferred to a first electrode RME1 may be applied to the first voltage line VL1, and a low potential voltage (or a second power voltage) transferred to a second electrode RME2 may be applied to the second voltage line VL2. A portion of the first voltage line VL1 may electrically contact the active layer ACT of the first transistor T1 through a contact hole penetrating through the interlayer insulating layer IL and the gate insulating layer GI. The first voltage line VL1 may serve as a first drain electrode D1 of the first transistor T1. The second voltage line VL2 may be directly connected to a second electrode RME2 to be described below. The first voltage line VL1 may be electrically connected to a first connection electrode CNE1 to be described below, and the second voltage line VL2 may be electrically connected to a second connection electrode CNE2 to be described below.

The first conductive pattern CDP1 may electrically contact the active layer ACT of the first transistor T1 through a contact hole penetrating through the interlayer insulating layer IL and the gate insulating layer GI. The first conductive pattern CDP1 may electrically contact the lower metal layer CAS through another contact hole. The first conductive pattern CDP1 may serve as a first source electrode Si of the first transistor T1.

A passivation layer PV may be disposed on the third conductive layer and the interlayer insulating layer IL. The passivation layer PV may perform a function of an insulating film between the third conductive layer and other layers disposed thereon, and may protect the third conductive layer.

The buffer layer BL, the gate insulating layer GI, the interlayer insulating layer IL, and the passivation layer PV described above may be formed as (or formed of) inorganic layers alternately stacked each other. For example, the buffer layer BL, the gate insulating layer GI, the interlayer insulating layer IL, and the passivation layer PV may be formed as a double layer in which inorganic layers including at least one of silicon oxide ($SiO_x$), silicon nitride ($SiN_x$), and silicon oxynitride ($SiO_xN_y$) are stacked each other, or multiple layers in which these double layers are alternately stacked each other. However, the disclosure is not limited thereto, the buffer layer BL, the gate insulating layer GI, the interlayer insulating layer IL, and the passivation layer PV may also be formed as an inorganic layer including the above-described insulating material. In some embodiments, the interlayer insulating layer IL may also be formed of an organic insulating material such as polyimide (PI).

The second conductive layer and the third conductive layer may be formed as a single layer or multiple layers made of at least one of molybdenum (Mo), aluminum (Al), chromium (Cr), gold (Au), titanium (Ti), nickel (Ni), neodymium (Nd), and copper (Cu), or alloys thereof. However, the disclosure is not limited thereto.

A via layer VIA may be disposed on the passivation layer PV. The via layer VIA may include an organic insulating material, for example, an organic material such as polyimide (PI), and may perform a surface planarization function.

Electrodes RME (RME1, RME2, RME3, and RME4), bank patterns BP1 and BP2, light emitting elements ED (ED1, ED2, ED3, and ED4), and connection electrodes CNE (CNE1, CNE2, CNE3, CNE4, and CNE5) may be disposed on the via layer VIA as a display device layer. Insulating layers PAS1, PAS2, and PAS3 may be disposed on the via layer VIA.

The bank patterns BP1 and BP2 may be disposed directly on the via layer VIA. The bank patterns BP1 and BP2 may include first bank patterns BP1 and a second bank pattern BP2. The first bank patterns BP1 may be disposed in the light emitting area EMA of the sub-pixel SPXn. The first bank patterns BP1 may have a shape extending in the second direction DR2 and may be spaced apart from each other in the first direction DR1. The first bank patterns BP1 may have a same width, but the disclosure is not limited thereto, and the first bank patterns BP1 may also have different widths. A length of the first bank patterns BP1 extending in the second direction DR2 may be smaller than a length of the light emitting area EMA surrounded by the bank layer BNL in the second direction DR2.

The second bank pattern BP2 may be disposed in the light emitting area EMA of the sub-pixel SPXn and may have a shape extending in the second direction DR2. The second bank pattern BP2 may be disposed between the first bank patterns BP1 to be spaced apart from the first bank patterns BP1. The second bank pattern BP2 may form an island-shaped pattern having a narrow width in the light emitting area EMA of each sub-pixel SPXn on the entire surface of the display area DPA and extending in the second direction DR2.

The second bank pattern BP2 is disposed at a central portion of the light emitting area EMA, and the first bank patterns BP1 are disposed to be spaced apart from the second bank pattern BP2 with the second bank pattern BP2 interposed (or disposed) therebetween. The first bank patterns BP1 and the second bank pattern BP2 may be alternately disposed in the first direction DR1. The light emitting elements ED may be disposed between the first bank pattern BP1 and the second bank pattern BP2 spaced apart from each other.

The first bank patterns BP1 and the second bank pattern BP2 may have a same length in the second direction DR2, but may have different widths measured in the first direction DR1. A portion of the bank layer BNL extending in the second direction DR2 may overlap the first bank patterns BP1 in the thickness direction (e.g., the third direction DR3). The bank patterns BP1 and BP2 may be disposed in an island-shaped pattern on the entire surface of the display area DPA. The light emitting elements ED may be disposed between the bank patterns BP1 and BP2 spaced apart from each other.

The bank patterns BP1 and BP2 may have a structure in which at least portions thereof protrude from a top surface of the via layer VIA. The protruding portions of the bank patterns BP1 and BP2 may have inclined or curved side surfaces. Unlike illustrated in the drawing, each of the configurations of the bank patterns BP1 and BP2 may have an outer surface of a semicircular or a semi-elliptical shape in a cross-sectional view. The bank patterns BP1 and BP2 may include an organic insulating material such as polyimide (PI), but are not limited thereto.

The electrodes RME may be disposed in each sub-pixel SPXn in a shape extending in a direction. The electrodes RME may extend in the second direction DR2 to be disposed across the light emitting area EMA and the sub-area SA of the sub-pixel SPXn, and may be disposed to be spaced apart from each other in the first direction DR1. The display device 10 may include a first electrode RME1, a second electrode RME2, a third electrode RME3, and a fourth electrode RME4 disposed in each sub-pixel SPXn. For example, the first electrode RME1 may be disposed on a left side of the light emitting area EMA, the second electrode RME2 may be spaced apart from the first electrode RME1 in the first direction DR1 and disposed in the central portion of the light emitting area EMA, the third electrode RME3 may be disposed between the first electrode RME1 and the second electrode RME2, and the fourth electrode RME4 may be disposed on a right side of the light emitting area EMA.

The first electrode RME1 may be disposed on the first bank pattern BP1 disposed on the left side of the light emitting area EMA, the second electrode RME2 may be disposed on a side of the second bank pattern BP2 disposed at the center of the light emitting area EMA, the third electrode RME3 may be disposed on another side of the second bank pattern BP2, and the fourth electrode RME4 may be disposed on the first bank pattern BP1 disposed on the right side of the light emitting area EMA. The electrodes RME may be disposed at least on the inclined side surface of each of the bank patterns BP1 and BP2. At least a portion of each of the electrodes RME may be disposed directly on the via layer VIA and disposed on a same plane.

The first electrode RME1 and the second electrode RME2 may be electrically connected to the third conductive layer through a first electrode contact hole CTD and a second electrode contact hole CTS formed in portions thereof overlapping the bank layer BNL, respectively. The first electrode RME1 may electrically contact the first conductive pattern CDP1 and the first voltage line VL1 through the first electrode contact hole CTD penetrating through the via layer VIA and the passivation layer PV on a lower side thereof. The first electrode contact hole CTD connects the first electrode RME1 to the first conductive pattern CDP1, so that the first power voltage of the first transistor T1 may be applied to the first electrode RME1 through the first conductive pattern CDP1. The first electrode RME1 may not receive a signal from the first voltage line VL1 because the first electrode RME1 is isolated from the first isolation portion ROP1 after alignment of the light emitting element ED as will be described below, and may be applied with a signal from the first transistor T1 through the first electrode contact hole CTD.

The second electrode RME2 may electrically contact the second voltage line VL2 through the second electrode contact hole CTS penetrating through the via layer VIA and the passivation layer PV on a lower side thereof. The first electrode RME1 may be electrically connected to the first transistor T1 through the first conductive pattern CDP1 to be applied with the first power voltage, and the second electrode RME2 may be electrically connected to the second voltage line VL2 to be applied with the second power voltage.

The first electrode RME1, the second electrode RME2, the third electrode RME3, and the fourth electrode RME4 disposed in different sub-pixels SPXn adjacent to each other in the second direction DR2 or in a direction opposite to the second direction DR2 may be spaced apart from each other in or by the first isolation portion ROP1 of the sub-area SA. Such an arrangement of the first electrode RME1, the second electrode RME2, the third electrode RME3, and the fourth electrode RME4 may be formed by forming an electrode line extending in the second direction DR2 and then isolating the electrode line in a subsequent process after the light emitting elements ED are disposed. The electrode line may be utilized to generate an electric field in the sub-pixel SPXn to align the light emitting element ED during a process of manufacturing the display device 10.

By isolating the electrode line from the first isolation portion ROP1 after the light emitting elements ED are aligned, the first electrode RME1, the second electrode RME2, the third electrode RME3, and the fourth electrode RME4 spaced apart from each other in the second direction DR2 may be formed. The process of isolating the electrode line may be performed after the process of forming the second insulating layer PAS2, and the second insulating layer PAS2 may not be disposed in the first isolation portion ROP1. The second insulating layer PAS2 may be used as a mask pattern in the process of isolating the electrode line.

The electrodes RME may be electrically connected to the light emitting element ED. Each of the electrodes RME may be electrically connected to the light emitting element ED through the connection electrodes CNE (CNE1, CNE2, CNE3, CNE4, and CNE5) to be described below, and may transmit an electrical signal applied from a lower conductive layer to the light emitting element ED.

Each of the electrodes RME may include a conductive material having high reflectivity. For example, the electrode RME may include a metal such as silver (Ag), copper (Cu), aluminum (Al), or the like, or may be an alloy including aluminum (Al), nickel (Ni), lanthanum (La), or the like, as the material having the high reflectivity. The electrode RME may reflect the light emitted from the light emitting element ED and traveling toward the side surfaces of the bank patterns BP1 and BP2 in an upward direction of each sub-pixel SPXn.

However, the disclosure is not limited thereto, and each electrode RME may further include a transparent conductive material. For example, each electrode RME may include a material such as ITO, IZO, or ITZO, but the embodiments are not limited thereto. In some embodiments, each of the electrodes RME may have a structure in which a transparent conductive material and a metal layer having high reflectivity are stacked each other in one or more layers, or may be formed as a layer including the transparent conductive material and the metal layer having the high reflectivity. For example, each electrode RME may have a stacked structure such as ITO/Ag/ITO, ITO/Ag/IZO, or ITO/Ag/ITZO/IZO.

A first insulating layer PAS1 may be disposed on the via layer VIA, the bank patterns BP1 and BP2, and the electrodes RME. The first insulating layer PAS1 may be disposed on the via layer VIA to cover (or overlap) the electrodes RME and the bank patterns BP1 and BP2. The first insulating layer PAS1 may not be disposed in the first isolation portion ROP1 in which the electrodes RME adjacent to each other in the second direction DR2 are spaced apart from each other in the sub-area SA. The first insulating layer PAS1 may protect the electrodes RME and insulate different electrodes RME from each other. The first insulating layer PAS1 may also prevent the light emitting element ED disposed thereon from being damaged by directly contacting other members. In an embodiment, the first insulating layer PAS1 may have a step (or height or thickness difference) formed so that a portion of a top surface thereof is recessed between the electrodes RME spaced apart from each other in the first direction DR1. The light emitting elements ED may be disposed on the top surface of the first insulating layer PAS1 in which the step is formed, and a space may also be formed between the light emitting elements ED and the first insulating layer PAS1. The space may be filled with a second insulating layer PAS2 to be described below.

The first insulating layer PAS1 may include contact portions CT1, CT2, CT3, and CT4 exposing a portion of the top surface of each electrode RME. The contact portions CT1, CT2, CT3, and CT4 may penetrate through the first insulating layer PAS1, and a first connection electrode CNE1, a second connection electrode CNE2, a third connection electrode CNE3, and a fifth connection electrode CNE5 to be described below may electrically contact the electrodes RME exposed through the contact portions CT1, CT2, CT3, and CT4, respectively.

The bank layer BNL may be disposed on the first insulating layer PAS1. The bank layer BNL may be disposed in a lattice pattern by including portions extending in the first direction DR1 and the second direction DR2 in a plan view, and be disposed across a boundary between the sub-pixels SPXn to distinguish the sub-pixels SPXn adjacent to each other. The bank layer BNL may be disposed to surround the light emitting area EMA and the sub-area SA, and areas partitioned and opened by the bank layer BNL may be the light emitting area EMA and the sub-area SA, respectively.

The bank layer BNL may have a height (e.g., a predetermined or selectable height), and in some embodiments, a height of a top surface of the bank layer BNL may be higher than that of the bank patterns BP1 and BP2, and a thickness of the bank layer BNL may be substantially equal to or greater than that of the bank patterns BP1 and BP2. However, the disclosure is not limited thereto, and the height of the top surface of the bank layer BNL may be substantially equal or smaller than that of the bank patterns BP1 and BP2, and the thickness of the bank layer BNL may be smaller than that of the bank patterns BP1 and BP2. The bank layer BNL may prevent ink from overflowing into an adjacent sub-pixel SPXn in an inkjet printing process of the process of manufacturing the display device 10. The bank layer BNL may prevent inks in which different light emitting elements ED are dispersed for each of different sub-pixels SPXn from being mixed with each other. The bank layer BNL may include polyimide like the bank patterns BP1 and BP2, but is not limited thereto.

The light emitting elements ED may be disposed on the first insulating layer PAS1. The light emitting element ED may include layers disposed in a direction parallel to a top surface of the substrate SUB. The light emitting element ED of the display device 10 may be disposed so that a direction in which the light emitting element ED extends is parallel to the substrate SUB, and the semiconductor layers included in the light emitting element ED may be sequentially disposed in the direction parallel to the top surface of the substrate SUB. However, the disclosure is not limited thereto. In some embodiments, in case that the light emitting element ED has another structure, the layers may also be disposed in a direction perpendicular to the substrate SUB.

The light emitting elements ED may be disposed between the bank patterns BP1 and BP2 or on different electrodes RME. Some of the light emitting elements ED may be disposed between the first bank pattern BP1 and the second bank pattern BP2, and others of the light emitting elements ED may be disposed between another first bank pattern BP1 and the second bank pattern BP2. According to an embodiment, the light emitting elements ED may include a first light emitting element ED1 disposed between the first bank pattern BP1 and the second bank pattern BP2 disposed on the upper left side in the light emitting area EMA, a second light emitting element ED2 disposed between the first bank pattern BP1 and the second bank pattern BP2 disposed on the upper right side in the light emitting area EMA, a third light emitting element ED3 disposed between the first bank pattern BP1 and the second bank pattern BP2 disposed on the lower left side in the light emitting area EMA, and a fourth light emitting element ED4 disposed between the first bank pattern BP1 and the second bank pattern BP2 disposed on the lower right side in the light emitting area EMA. The first light emitting element ED1 and the third light emitting element ED3 may be disposed on the first electrode RME1 and the third electrode RME3, and the second light emitting elements ED2 and the fourth light emitting elements ED4 may be disposed on the second electrode RME2 and the fourth electrode RME4. However, each of the light emitting elements ED is not classified according to a position disposed in the light emitting area EMA, but may be classified according to a connection relationship with the connection electrode CNE, which will be described below. Each of the light emitting elements ED may have ends electrically contacting different connection electrodes CNE according to an arrangement structure of the connection electrodes CNE, and may be classified into different light emitting elements ED according to the type of the connection electrode CNE electrically contacting the light emitting element ED.

The light emitting elements ED may be electrically connected to each other by electrically contacting the connection electrodes CNE1, CNE2, CNE3, CNE4, and CNE5. Since a portion of the semiconductor layer is exposed on end surfaces of the light emitting elements ED in an extended direction, the exposed semiconductor layer may electrically contact the connection electrodes CNE. Each of the light emitting elements ED may be electrically connected to the conductive layers on a lower side of the electrode RME and the via layer VIA through the connection electrodes CNE, and may be applied with an electrical signal to emit light of a specific wavelength band.

A second insulating layer PAS2 may be disposed on the light emitting elements ED and the first insulating layer PAS1. The second insulating layer PAS2 may include a pattern portion extending in the second direction DR2 between the bank patterns BP1 and BP2 and disposed on the light emitting elements ED. The pattern portion may be disposed to partially surround an outer surface of the light emitting element ED, and may not cover sides or ends of the light emitting element ED. The pattern portion may form a linear or island-shaped pattern in each sub-pixel SPXn in a plan view. The pattern portion of the second insulating layer PAS2 may protect the light emitting elements ED, and fix the light emitting elements ED in the process of manufacturing the display device 10.

The second insulating layer PAS2 may also be disposed to fill a space between the light emitting element ED and the first insulating layer PAS1 on the lower side thereof. For example, the second insulating layer PAS2 may be formed to completely cover the light emitting elements ED, and then patterned to expose ends of the light emitting elements ED, and a portion of the second insulating layer PAS2 may fill the space between the light emitting elements ED and the first insulating layer PAS1 on the lower side thereof.

A portion of the second insulating layer PAS2 may be disposed on the bank layer BNL and in the sub-areas SA. The second insulating layer PAS2 may include contact portions CT1, CT2, CT3, and CT4 disposed in the sub-area SA. The second insulating layer PAS2 may include a first contact portion CT1 disposed to overlap the first electrode RME1, a second contact portion CT2 disposed to overlap the second electrode RME2, a third contact portion CT3 disposed to overlap the third electrode RME3, and a fourth contact portion CT4 disposed to overlap the fourth electrode RME4. The contact portions CT1, CT2, CT3, and CT4 may also penetrate through the second insulating layer PAS2 in addition to the first insulating layer PAS1. The first contact portion CT1, the second contact portion CT2, the third contact portion CT3, and the fourth contact portion CT4 may expose portions of the top surfaces of the first electrode RME1, the second electrode RME2, the third electrode RME3, and the fourth electrode RME4 on the lower side thereof, respectively.

The connection electrodes CNE1, CNE2, CNE3, CNE4, and CNE5 may include a first connection electrode CNE1, a second connection electrode CNE2, a third connection electrode CNE3, a fourth connection electrode CNE4, and a fifth connection electrode CNE5.

The first connection electrode CNE1 may have a shape extending in the second direction DR2 and may be disposed on the first electrode RME1. A portion of the first connection electrode CNE1 disposed on the first bank pattern BP1 may overlap the first electrode RME1, and the first connection electrode CNE1 may extend in the second direction DR2 from the overlapping portion to be disposed up to the sub-area SA positioned on the upper side of the light emitting area EMA beyond the bank layer BNL. The first connection electrode CNE1 may be electrically connected to at least one of the first electrode RME1 and the first conductive pattern CDP1 through the first contact portion CT1 in the sub-area SA.

The second connection electrode CNE2 may have a shape extending in the second direction DR2 and be disposed on the second electrode RME2. A portion of the second connection electrode CNE2 disposed on the second bank pattern BP2 may overlap the second electrode RME2, and the second connection electrode CNE2 may extend in the second direction DR2 from the overlapping portion to be disposed up to the sub-area SA positioned on the upper side of the light emitting area EMA beyond the bank layer BNL. The second connection electrode CNE2 may electrically contact the second voltage line VL2 through the second contact portion CT2 in the sub-area SA.

The first connection electrode CNE1 may be disposed adjacent to the second connection electrode CNE2 with the third connection electrode CNE3 interposed therebetween. The first connection electrode CNE1 and the second connection electrode CNE2 may be disposed parallel to each other and may be disposed to extend across the light emitting area EMA and the sub-area SA.

The third connection electrode CNE3 may be disposed to overlap the first electrode RME1 and the third electrode RME3. The third connection electrode CNE3 may include a first extension portion CN_E1 and a second extension portion CN_E2 extending in the second direction DR2, and a first connection portion CN_B1 connecting the first extension portion CN_E1 and the second extension portion CN_E2. The first extension portion CN_E1 is disposed on the third electrode RME3 in the light emitting area EMA, and the second extension portion CN_E2 is disposed on the first electrode RME1 in the light emitting area EMA. The first extension portion CN_E1 may be spaced apart from and face the first connection electrode CNE1 in the first direction DR1, and the second extension portion CN_E2 may be spaced apart from the first connection electrode CNE1 in the second direction DR2. The first extension portion CN_E1 may be disposed at an upper side of the light emitting area EMA of the corresponding sub-pixel SPXn, and the second extension portion CN_E2 may be disposed at a lower side of the light emitting area EMA of the sub-pixel SPXn. The first connection portion CN_B1 may extend in the first direction DR1 within the light emitting area EMA to electrically connect the first extension portion CN_E1 and the second extension portion CN_E2 to each other. The first connection portion CN_B1, the first extension portion CN_E1, and the second extension portion CN_E2 may be integral with each other. The third connection electrode CNE3 may generally have a shape extending in the second direction DR2, and may have a shape that is bent in the first direction DR1 and extends again in the second direction DR2. The third connection electrode CNE3 may be disposed on the light emitting area EMA and the sub-area SA, and may be electrically connected to the third electrode RME3. The third connection electrode CNE3 may transmit a signal applied through the light emitting elements ED. The first light emitting element ED1 and the third light emitting element ED3 may be electrically connected in series with each other through the third connection electrode CNE3.

The fourth connection electrode CNE4 may include a third extension portion CN_E3 disposed on the third electrode RME3, a fourth extension portion CN_E4 disposed on the fourth electrode RME4, and a second connection portion CN_B2 electrically connecting the third extension portion CN_E3 and the fourth extension portion CN_E4 to each other. The second connection portion CN_B2, the third extension portion CN_E3, and the fourth extension portion CN_E4 may be integral with each other. The third extension portion CN_E3 may be spaced apart from and face the second extension portion CN_E2 of the third connection electrode CNE3 in the first direction DR1, and the fourth extension portion CN_E4 may be spaced apart from and face a fifth extension portion CN_E5 of the fifth connection electrode CNE5 in the first direction DR1 to be described below. Each of the third extension portion CN_E3 and the fourth extension portion CN_E4 may be disposed at the lower side of the light emitting area EMA, and the second connection portion CN_B2 may be disposed across the third electrode RME3, the second electrode RME2, and the fourth electrodes RME4. The fourth connection electrode CNE4 may be disposed to surround the fifth extension portion CN_E5 of the fifth connection electrode CNE5 in a plan view.

The fifth connection electrode CNE5 may include a fifth extension portion CN_E5 disposed on the second electrode RME2, a sixth extension portion CN_E6 disposed on the fourth electrode RME4, and a third connection portion CN_B3 connecting the fifth extension portion CN_E5 and the sixth extension portion CN_E6 to each other. The third connection portion CN_B3, the fifth extension portion CN_E5, and the sixth extension portion CN_E6 may be integral with each other. The fifth extension portion CN_E5 may be spaced apart from and face the fourth extension portion CN_E4 of the fourth connection electrode CNE4 in the first direction DR1, and the sixth extension portion CN_E6 may be spaced apart from and face the second connection electrode CNE2 in the first direction DR1. The fifth extension portion CN_E5 may be disposed at the lower side of the light emitting area EMA of the corresponding sub-pixel SPXn, and the sixth extension portion CN_E6 may be disposed at the upper side of the light emitting area EMA. The sixth extension portion CN_E6 may be disposed across the light emitting area EMA and the sub-area SA to be electrically connected to the fourth electrode RME4 through the fourth contact portion CT4 formed in the sub-area SA. The third connection portion CN_B3 may be disposed across the second electrode RME2 and the fourth electrode RME4. The fifth connection electrode CNE5 may generally have a shape extending in the second direction DR2, and may have a shape that is bent in the first direction DR1 and then extends again in the second direction DR2.

The first connection electrode CNE1 and the second connection electrode CNE2 may be first type connection electrodes electrically contacting the first electrode RME1 and the second electrode RME2 directly connected to the third conductive layer, respectively, the third connection electrode CNE3 and the fifth connection electrode CNE5 may be second type connection electrodes electrically contacting the third electrode RME3 and the fourth electrode RME4 that are not directly connected to the third conductive layer, and the fourth connection electrode CNE4 may be a third type connection electrode that does not directly contact any of the electrodes RME.

In response to the above-described structure of the connection electrodes CNE, the light emitting elements ED may be classified into different light emitting elements ED according to the connection electrodes CNE which ends of the light emitting elements ED electrically contact. The first light emitting element ED1 may have an end electrically contacting the first connection electrode CNE1 and another end electrically contacting a portion (the first extension portion CN_E1) of the third connection electrode CNE3. The second light emitting element ED2 may have an end electrically contacting the second connection electrode CNE2 and another end electrically contacting another portion (the sixth extension portion CN_E6) of the fifth connection electrode CNE5. The third light emitting element ED3 may have an end electrically contacting a portion (the second extension portion CN_E2) of the third connection electrode CNE3 and another end electrically contacting a portion (the third extension portion CN_E3) of the fourth connection electrode CNE4. The fourth light emitting element ED4 may have an end electrically contacting a portion (the fifth extension portion CN_E5) of the fifth connection electrode CNE5 and another end electrically contacting a portion (the fourth extension portion CN_E4) of the fourth connection electrode CNE4

An end of the first light emitting element ED1 may be electrically connected to the first electrode RME1 directly connected to the third conductive layer, and an end of the second light emitting element ED2 may also be electrically connected to the second electrode RME2 directly connected to the third conductive layer. The first light emitting element ED1 and the third light emitting element ED3 may be electrically connected to each other through the third connection electrode CNE3, the third light emitting element ED3 and the fourth light emitting element ED4 may be electrically connected to each other through the fourth connection electrode CNE4, and the fourth light emitting element ED4 and the second light emitting element ED2 may be electrically connected to each other through the fifth connection electrode CNE5. The first light emitting element ED1, the third light emitting element ED3, the fourth light emitting element ED4, and the second light emitting element ED2 may be electrically connected to each other in series through the connection electrodes CNE.

A third insulating layer PAS3 is disposed on the third connection electrode CNE3, the fifth connection electrode CNE5, the first insulating layer PAS1, and the second insulating layer PAS2. The third insulating layer PAS3 is disposed to cover the third connection electrode CNE3 and the fifth connection electrode CNE5 to insulate the third connection electrode CNE3 and the fifth connection electrode CNE5 from the first connection electrode CNE1 and the second connection electrode CNE2 adjacent thereto. The first connection electrode CNE1 and the second connection electrode CNE2 may be disposed on the third insulating layer PAS3.

Although not illustrated in the drawings, an insulating layer may be further disposed on the third insulating layer PAS3. The insulating layer may serve to protect the members disposed on the substrate SUB from external environments. The first insulating layer PAS1, the second insulating layer PAS2, and the third insulating layer PAS3 described above may include an inorganic insulating material or an organic insulating material.

According to an embodiment, an auxiliary electrode AXE may be disposed between the sub-pixels SPXn. The auxiliary electrode AXE may extend in the second direction DR2. For example, the auxiliary electrodes AXE may extend in parallel with each of the electrodes RME1, RME2, RME3, and RME4, and may be disposed to be spaced apart from each other in the first direction DR1. The auxiliary electrodes AXE may be disposed to be spaced apart from each other in the first direction DR1 with the light emitting area EMA and the sub-area SA of each sub-pixel SPXn interposed therebetween. For example, the auxiliary electrode AXE and the sub-pixel SPXn may be alternately disposed in the first direction DR1.

The auxiliary electrode AXE may be disposed on the via layer VIA. The auxiliary electrode AXE may be disposed between the via layer VIA and the first bank pattern BP1, and may be disposed directly on the top surface of the via layer VIA. The auxiliary electrode AXE may be covered by the first bank pattern BP1 to be insulated from the electrodes RME disposed on the first bank pattern BP1. The auxiliary electrode AXE may be disposed in parallel with the electrodes RME in a plan view and may be disposed to be spaced apart from the electrodes RME. The auxiliary electrode AXE may be disposed to overlap the bank layer BNL.

The auxiliary electrode AXE may include a conductive material, for example, a metal such as silver (Ag), copper (Cu), aluminum (Al), or the like, or an alloy including aluminum (Al), nickel (Ni), lanthanum (La), or the like. In addition, the auxiliary electrode AXE may include a transparent conductive material, for example, a material such as ITO, IZO, ITZO, or the like. In some embodiments, the auxiliary electrode AXE may have a structure in which the transparent conductive material and the metal layer are respectively stacked each other in one or more layers, or may be formed of a single layer including the transparent conductive material and the metal layer. For example, the auxiliary electrode AXE may have a stacked structure such as Ag/ITO, ITO/Ag/ITO, ITO/Ag/IZO, or ITO/Ag/ITZO/IZO.

In an embodiment, the auxiliary electrode AXE may be an electrode to which an alternating current (AC) signal is applied. As will be described below, in case that the AC signal is applied to the auxiliary electrode AXE after ink including the light emitting element ED is sprayed onto the substrate SUB, a flow of ink may be caused by an AC electroosmosis (ACEO) phenomenon to move the light emitting element ED on the bank layer BNL to the light emitting area EMA. The AC electroosmosis (ACEO) is a phenomenon in which ions inside the fluid form a thin electric double layer at an electrode surface and a liquid interface in a non-uniform electric field, and the fluid moves along the electrode surface under the influence of a tangential electric field formed by a voltage. Such an electroosmosis phenomenon may cause the fluid to flow in a direction in which an electric field is strong. The auxiliary electrode AXE may be applied with a low frequency signal, for example, a sine wave of about 50 Hz or less.

In an embodiment, the auxiliary electrode AXE is formed around the light emitting area EMA to overlap the bank layer BNL, and in case that the ink is applied, the ink may flow due to the AC electroosmosis phenomenon. The flow of ink may swirl in a peripheral direction on an upper side of the bank layer BNL, and such a swirl may move the light emitting elements ED existing on the upper side of the bank layer BNL to the light emitting area EMA. Accordingly, a luminance of the sub-pixel SPXn may be improved by disposing the light emitting elements ED that are seated on the bank layer BNL and emit no light in the light emitting area EMA. A more detailed description will be provided in a manufacturing method to be described below.

Figure 6:
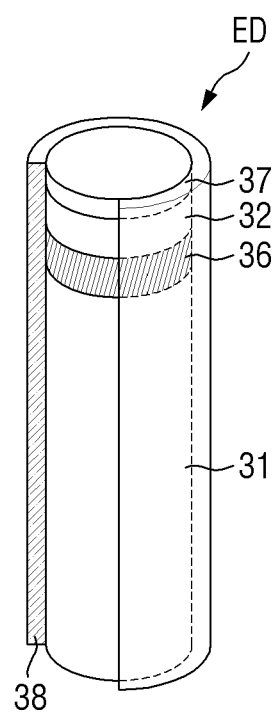
FIG. 6 is a schematic perspective view illustrating a light emitting element according to an embodiment.

FIG. 6 is a schematic perspective view illustrating a light emitting element according to an embodiment.

Referring to FIG. 6, the light emitting element ED may be a light emitting diode. Specifically, the light emitting element ED may be an inorganic light emitting diode having a size of nanometers to micrometers and made of an inorganic material. The light emitting element ED may be aligned between two electrodes in which polarities are formed in case that an electric field is formed in a specific direction between the two electrodes facing each other.

The light emitting element ED according to an embodiment may have a shape extending in a direction. The light emitting element ED may have a shape such as a cylinder, a rod, a wire, or a tube. However, the shape of the light emitting element ED is not limited thereto and the light emitting element ED may have various shapes. For example, the light emitting element ED may have a polygonal prismatic shape such as a cubic shape, a rectangular parallelepiped shape, or a hexagonal prismatic shape or have a shape extending in a direction and having an outer surface partially inclined.

The light emitting element ED may include a semiconductor layer doped with an arbitrary conductivity type (e.g., p-type or n-type) impurity. The semiconductor layer may receive an electrical signal applied from an external power source to emit light of a specific wavelength band. The light emitting element ED may include a first semiconductor layer 31, a second semiconductor layer 32, a light emitting layer 36, an electrode layer 37, and an insulating layer 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, and $0 \leq x+y$ 1). For example, the first semiconductor layer 31 may be at least one of AlGaInN, GaN, AlGaN, InGaN, AlN, and InN doped with an n-type dopant. The n-type dopant doped in the first semiconductor layer 31 may be Si, Ge, Se, Sn, or the like but is not limited thereto.

The second semiconductor layer 32 is disposed on the first semiconductor layer 31 with the light emitting layer 36 interposed therebetween. The second semiconductor layer 32 may be a p-type semiconductor, and may include a semiconductor material having a chemical formula of $Al_xGa_yIn_{1-x-y}N$ ($0 \leq x \leq 1$, $0 \leq y \leq 1$, and $0 \leq x+y \leq 1$). For example, the second semiconductor layer 32 may be at least one of AlGaInN, GaN, AlGaN, InGaN, AlN, and InN doped with a p-type dopant. The p-type dopant doped in the second semiconductor layer 32 may be Mg, Zn, Ca, Ba, or the like but is not limited thereto.

FIG. 6 illustrates that the first semiconductor layer 31 and the second semiconductor layer 32 are configured as a layer, but the disclosure is not limited thereto. The first semiconductor layer 31 and the second semiconductor layer 32 may further include a larger number of layers, for example, a clad layer or a tensile strain barrier reducing (TSBR) layer, according to a material of the light emitting layer 36.

The light emitting layer 36 is disposed between the first semiconductor layer 31 and the second semiconductor layer 32. The light emitting layer 36 may include a material having a single or multiple quantum well structure. In case that the light emitting layer 36 includes the material having the multiple quantum well structure, the light emitting layer 36 may have a structure in which quantum layers and well layers are alternately stacked each other. The light emitting layer 36 may emit light by a combination of electron-hole pairs according to electrical signals applied through the first semiconductor layer 31 and the second semiconductor layer 32. The light emitting layer 36 may include a material such as AlGaN or AlGaInN. In case that the light emitting layer 36 has the multiple quantum well structure, for example, the structure in which the quantum layers and the well layers are alternately stacked each other, the quantum layers may include a material such as AlGaN or AlGaInN, and the well layers may include a material such as GaN or AlInN.

The light emitting layer 36 may also have a structure in which semiconductor materials having a large band gap energy and semiconductor materials having a small band gap energy are alternately stacked each other, and may also include other Group III to Group V semiconductor materials according to a wavelength band of emitted light. The light emitted by the light emitting layer 36 is not limited to light of a blue wavelength band, and in some embodiments, the light emitting layer 36 may also emit light of red and green wavelength bands.

The electrode layer 37 may be an ohmic connection electrode. However, the disclosure is not limited thereto, and the electrode layer 37 may also be a Schottky connection electrode. The light emitting element ED may include at least one electrode layer 37. The light emitting element ED may include one or more electrode layers 37, but the disclosure is not limited thereto, and the electrode layer 37 may also be omitted.

The electrode layer 37 may decrease resistance between the light emitting element ED and the electrode or the connection electrode in case that the light emitting element ED is electrically connected to the electrode or the connection electrode in the display device 10. The electrode layer 37 may include a metal having conductivity. For example, the electrode layer 37 may include at least one of aluminum (Al), titanium (Ti), indium (In), gold (Au), silver (Ag), indium tin oxide (ITO), indium zinc oxide (IZO), and indium tin zinc oxide (ITZO).

The insulating layer 38 is disposed to surround outer surfaces of the semiconductor layers and the electrode layer described above. For example, the insulating layer 38 may be disposed to surround at least an outer surface of the light emitting layer 36, but may be formed to expose ends of the light emitting element ED in a length direction. The insulating layer 38 may also be formed so that a top surface thereof is rounded in a cross-sectional view in an area adjacent to at least one end portion of the light emitting element ED.

The insulating layer 38 may include materials having insulating properties, for example, silicon oxide ($SiO_x$), silicon nitride ($SiN_x$), silicon oxynitride ($SiO_xN_y$), aluminum nitride ($AlN_x$), and aluminum oxide ($AlO_x$). FIG. 6 illustrates that the insulating layer 38 is formed as a single layer, but the disclosure is not limited thereto, and in some embodiments, the insulating layer 38 may also be formed in a multilayer structure in which layers are stacked each other.

The insulating layer 38 may perform a function of protecting the members. The insulating layer 38 may prevent an electrical short that may occur in the light emitting layer 36 in case that the light emitting element ED electrically contacts an electrode through which an electrical signal is transmitted thereto. The insulating layer 38 may prevent a decrease in emission efficiency of the light emitting element ED.

An outer surface of the insulating layer 38 may be surface-treated. The light emitting elements ED may be sprayed onto the electrode in a state of being dispersed in an ink to be aligned. In order to maintain the light emitting elements ED in a state in which the light emitting elements ED are dispersed without being clustered with other adjacent light emitting elements ED in the ink, a hydrophobic or hydrophilic treatment may be performed on a surface of the insulating layer 38.

Hereinafter, other embodiments of the display device 10 will be described with further reference to other drawings.

Figure 7:
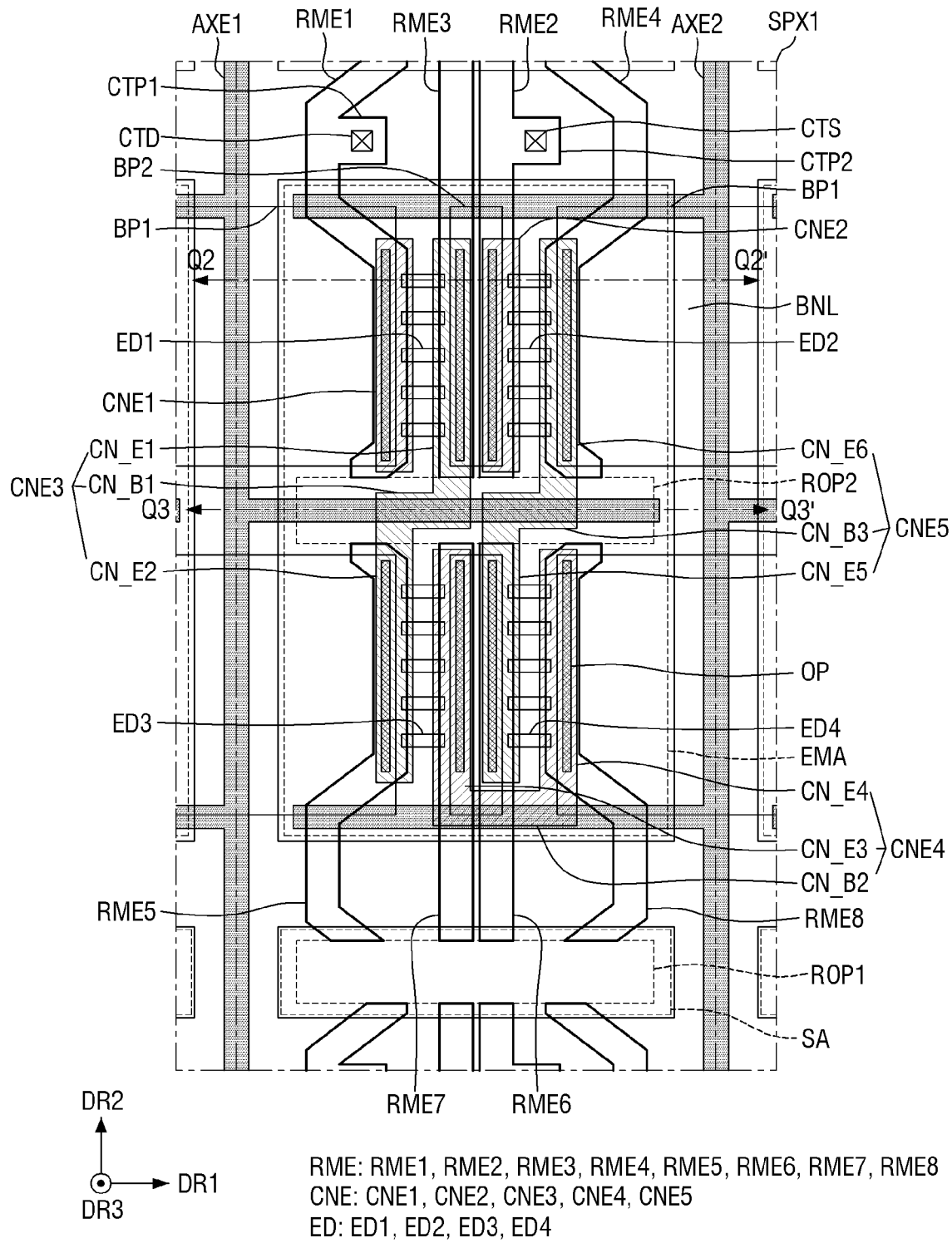
FIG. 7 is a schematic plan view illustrating a first sub-pixel of a display device according to another embodiment.
Figure 8:
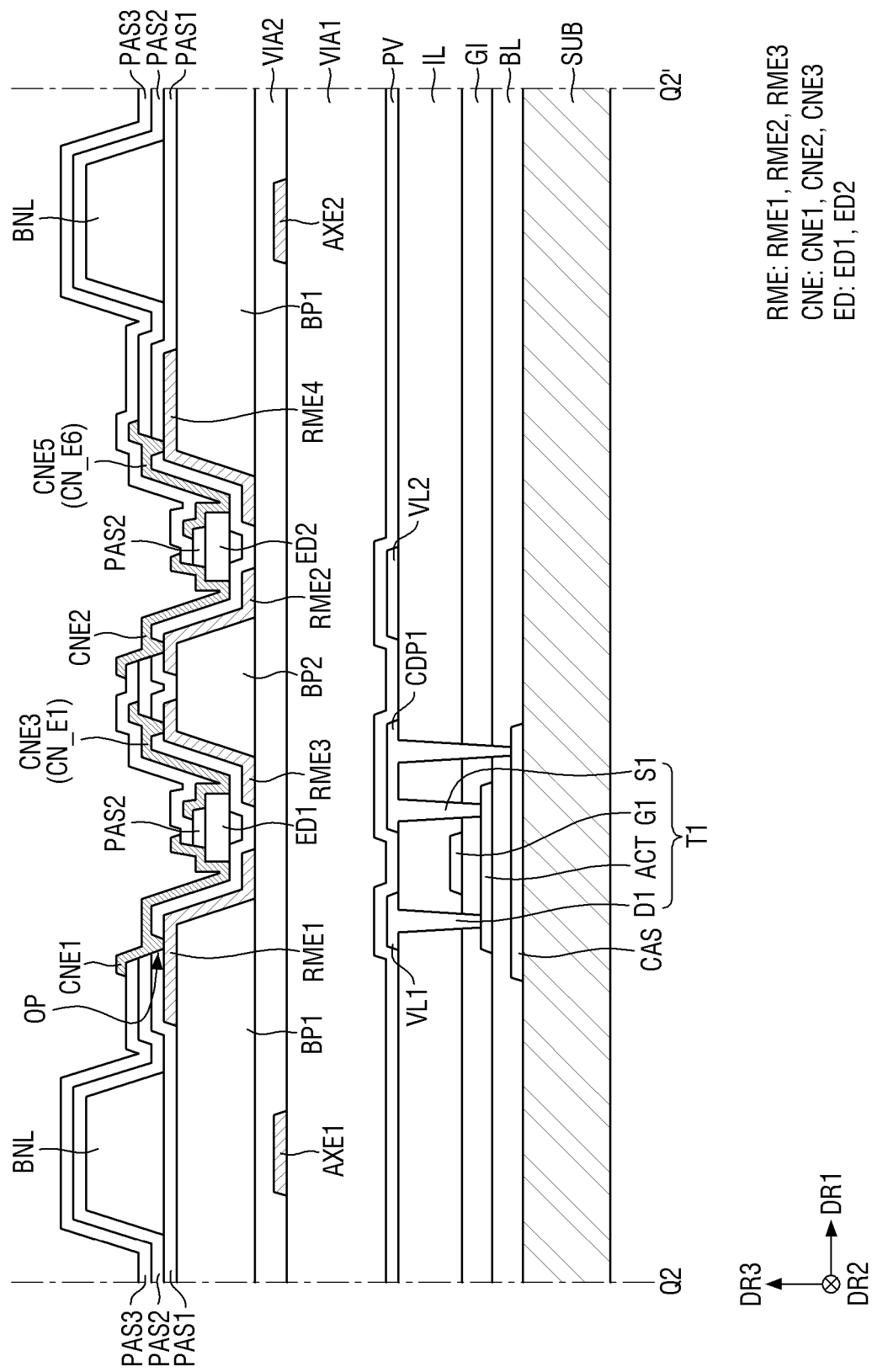
FIG. 8 is a schematic cross-sectional view taken along line Q2-Q2' of FIG. 7.
Figure 9:
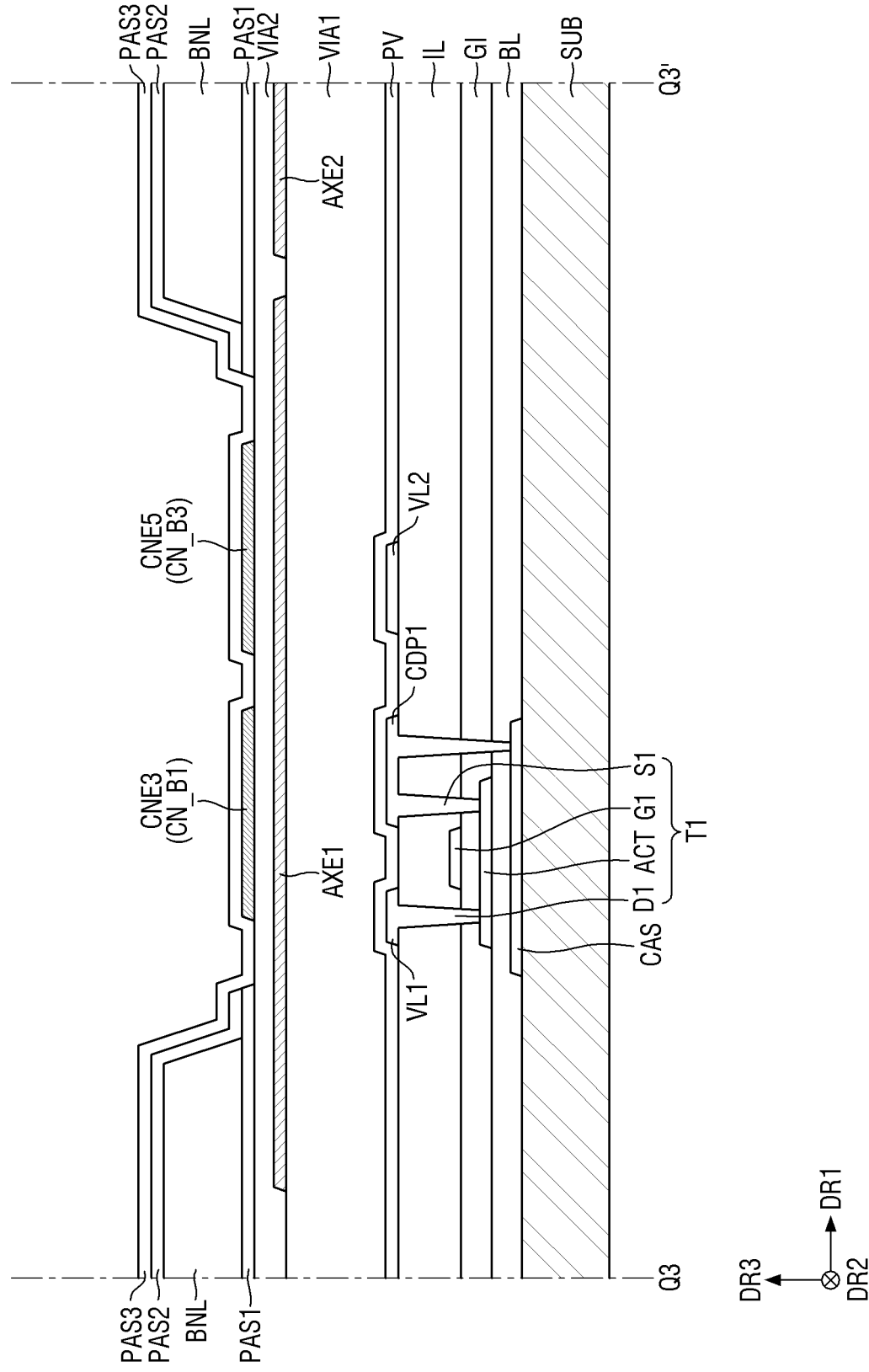
FIG. 9 is a schematic cross-sectional view taken along line Q3-Q3' of FIG. 7.
Figure 10:
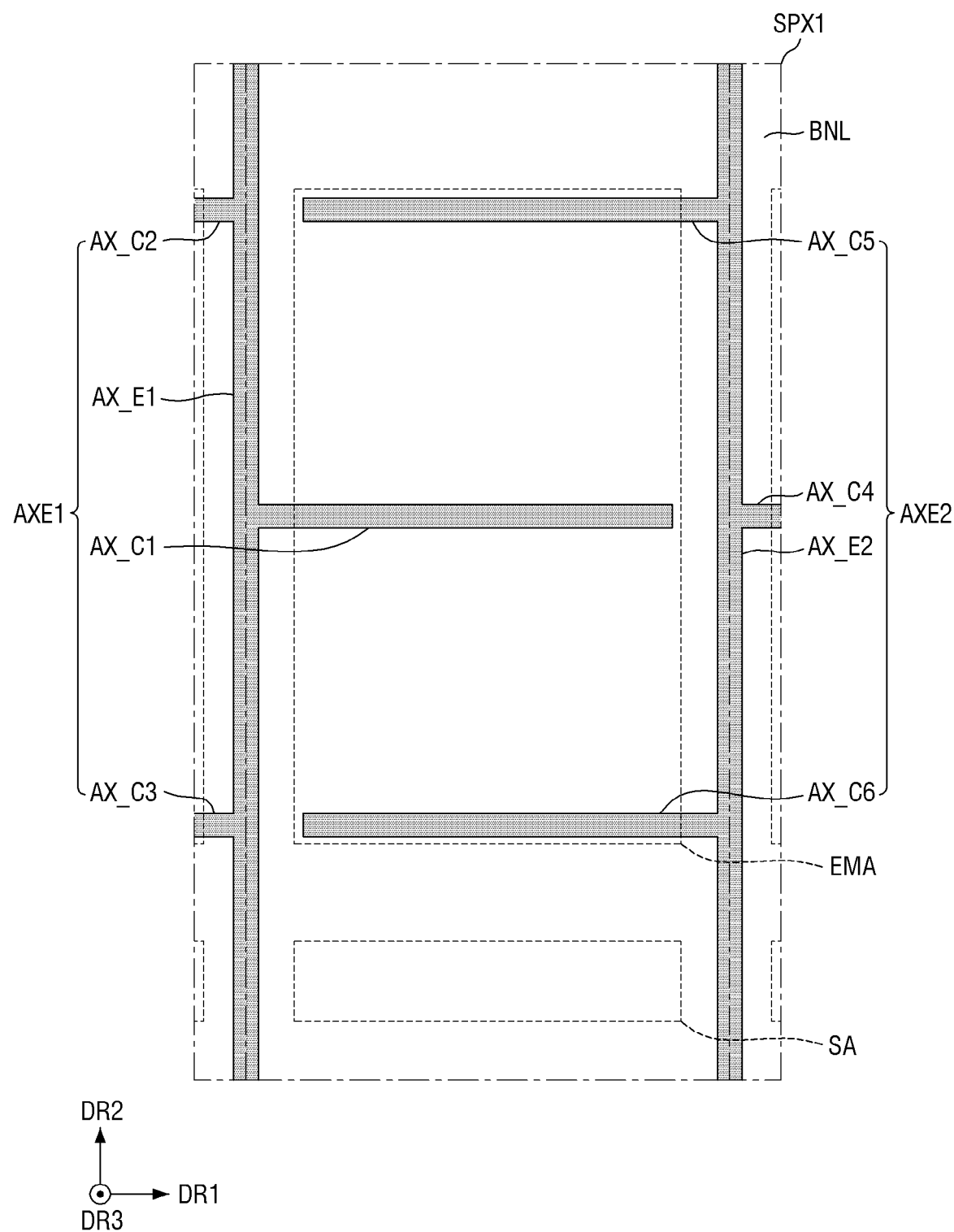
FIG. 10 is a schematic plan view illustrating shapes of auxiliary electrodes of FIG. 7.

FIG. 7 is a schematic plan view illustrating a first sub-pixel of a display device according to another embodiment. FIG. 8 is a schematic cross-sectional view taken along line Q2-Q2' of FIG. 7. FIG. 9 is a schematic cross-sectional view taken along line Q3-Q3' of FIG. 7. FIG. 10 is a schematic plan view illustrating shapes of auxiliary electrodes of FIG. 7.

Referring to FIGS. 7 to 10, the embodiment is different from the embodiment described with reference to FIGS. 3 to 5 in that the structures of the electrodes RME are partially different, and the auxiliary electrode AXE further includes branch portions AX_C1, AX_C2, and AX_C3 branched in the first direction DR1. Hereinafter, descriptions overlapping the above-described embodiment will be omitted and differences from the above-described embodiment will be described.

According to an embodiment, the display device 10 may include a larger number of electrodes RME1, RME2, RME3, RME4, RME5, RME6, RME7, and RME8 for each sub-pixel SPXn.

The first bank patterns BP1 may extend in the second direction DR2, and may be disposed to be spaced apart from each other in the second direction DR2, and the second bank patterns BP2 may also extend in the second direction DR2, and may be disposed to be spaced apart from each other in the second direction DR2. The embodiment is different from the embodiment described above with reference to FIG. 4 in that the first bank patterns BP1 and the second bank patterns BP2 are spaced apart from each other in the second direction DR2 at the central portion of the light emitting area EMA, respectively.

A first electrode RME1, a fourth electrode RME4, a fifth electrode RME5, and an eighth electrode RME8 may have a shape that generally extends in the second direction DR2, is partially bent, and is bent again to extend in the second direction DR2. On the other hand, a second electrode RME2, a third electrode RME3, a sixth electrode RME6, and a seventh electrode RME7 may have a shape extending in the second direction DR2. The first electrode RME1, the fourth electrode RME4, the fifth electrode RME5, and the eighth electrode RME8 may be disposed on the first bank patterns BP1, and the second electrode RME2, the third electrode RME3, the sixth electrode RME6, and the seventh electrode RME7 may be disposed on the second bank patterns BP2.

The first electrode RME1 may be disposed on the upper left side with respect to the center of the light emitting area EMA. A portion of the first electrode RME1 may be disposed on the first bank pattern BP1 disposed on an upper side among the first bank patterns BP1 disposed across the sub-pixel SPXn adjacent to the side opposite to the first direction DR1. The second electrode RME2 may be disposed on a side of the second bank pattern BP2 disposed on the upper side in the first direction DR1 among the second bank patterns BP2.

The third electrode RME3 may be disposed between the first electrode RME1 and the second electrode RME2, and may be disposed on a side opposite to the second bank pattern BP2 on which the second electrode RME2 is disposed in the first direction DR1. The third electrode RME3 may be spaced apart from the first electrode RME1 and the second electrode RME2, respectively, and the first light emitting element ED1 may be disposed between the first electrode RME1 and the third electrode RME3 spaced apart from each other. The fourth electrode RME4 may be disposed on the upper right side with respect to the center of the light emitting area EMA. A portion of the fourth electrode RME4 may be disposed on the first bank pattern BP1 disposed on an upper side among the first bank patterns BP1 disposed across the sub-pixel SPXn adjacent to one side in the first direction DR1. The fourth electrode RME4 may be disposed to be spaced apart from the second electrode RME2, and the second light emitting element ED2 may be disposed between the second electrode RME2 and the fourth electrode RME4 spaced apart from each other.

The fifth electrode RME5 may be disposed to be spaced apart from the first electrode RME1 in the second direction DR2, and may be disposed on the lower left side with respect to the center of the light emitting area EMA. A portion of the fifth electrode RME5 may be disposed on the first bank pattern BP1 disposed on a lower side among the first bank patterns BP1 disposed across the sub-pixel SPXn adjacent to an opposite side in the first direction DR1. The sixth electrode RME6 may be disposed to be spaced apart from the second electrode RME2 in the second direction DR2. The sixth electrode RME6 may be disposed on a side of the second bank pattern BP2 disposed on a lower side of the second bank pattern BP2 in the first direction DR1.

The seventh electrode RME7 may be disposed between the fifth electrode RME5 and the sixth electrode RME6. The seventh electrode RME7 may be disposed to be spaced apart from the third electrode RME3 in the second direction DR2. The seventh electrode RME7 may be disposed on the second bank pattern BP2 disposed on the lower side among the second bank patterns BP2. The seventh electrode RME7 may face the fifth electrode RME5 and may be spaced apart from the fifth electrode RME5 in the first direction DR1, and the third light emitting element ED3 may be disposed between the seventh electrode RME7 and the fifth electrode RME5 spaced apart from each other. The eighth electrode RME8 may be disposed to be spaced apart from the sixth electrode RME6 in the first direction DR1, and may be disposed on the lower right side with respect to the center of the light emitting area EMA. A portion of the eighth electrode RME8 may be disposed on the first bank pattern BP1 disposed on the lower side among the first bank patterns BP1 disposed across the sub-pixel SPXn adjacent to the side in the first direction DR1. The fourth light emitting element ED4 may be disposed between the eighth electrode RME8 and the sixth electrode RME6 spaced apart from each other.

The first electrode RME1, the third electrode RME3, the second electrode RME2, and the fourth electrode RME4 disposed on the upper side with respect to the center of the light emitting area EMA may be spaced apart from the fifth electrode RME5, the seventh electrode RME7, the sixth electrode RME6, and the eighth electrode RME8 disposed on the lower side in the second direction DR2, respectively. An area in which the electrodes are spaced apart from each other in the second direction DR2 may be an area in which the electrode line is isolated from a second isolation portion ROP2 during the process of manufacturing the display device 10.

The first electrode RME1 and the second electrode RME2 may have electrode contact portions CTP1 and CTP2 formed in areas thereof overlapping the bank layer BNL, and may be directly connected to the second conductive layer through the electrode contact holes CTD and CTS. On the other hand, the third electrode RME3, the fourth electrode RME4, the fifth electrode RME5, the sixth electrode RME6, the seventh electrode RME7, and the eighth electrode RME8 except for the first electrode RME1 and the second electrode RME2 may not be directly connected to the second conductive layer.

The first insulating layer PAS1 may include openings OP exposing a portion of the top surface of each electrode RME. The openings OP may penetrate through the first insulating layer PAS1, and a first connection electrode CNE1, a second connection electrode CNE2, a third connection electrode CNE3, and a fifth connection electrode CNE5 to be described below may electrically contact the electrodes RME exposed through the openings OP, respectively.

According to an embodiment, each sub-pixel SPXn may include a first auxiliary electrode AXE1 and a second auxiliary electrode AXE2 spaced apart from each other with the light emitting area EMA and the sub-area SA interposed therebetween. The first auxiliary electrode AXE1 and the second auxiliary electrode AXE2 may extend in the second direction DR2, and may be disposed to be spaced apart from each other with the light emitting areas EMA of each sub-pixel SPXn and the sub-areas SA of each sub-pixel SPXn interposed therebetween. For example, the first auxiliary electrode AXE1 may be disposed on the left side of the light emitting area EMA and the sub-area SA, and the second auxiliary electrode AXE2 may be disposed on the right side of the light emitting area EMA and the sub-area SA. Each of the auxiliary electrodes AXE1 and AXE2 may have a structure shared by the sub-pixels SPXn adjacent to each other. For example, the first auxiliary electrode AXE1 of the first sub-pixel SPX1 may correspond to the second auxiliary electrode AXE2 of the sub-pixel SPXn disposed on the left side of the first sub-pixel SPX1. The second auxiliary electrode AXE2 disposed on the right side of the first sub-pixel SPX1 may correspond to the first auxiliary electrode AXE1 of the sub-pixel SPXn disposed on the right side of the first sub-pixel SPX1. The first auxiliary electrode AXE1 and the second auxiliary electrode AXE2 may have a same planar shape.

The first auxiliary electrode AXE1 may include a first auxiliary extension portion AX_E1 extending in the second direction DR2, a first branch portion AX_C1 branched from the first auxiliary extension portion AX_E1 in the first direction DR1, and a second branch portion AX_C2 and a third branch portion AX_C3 branched from the first auxiliary extension portion AX_E1 in a direction opposite to the first direction DR1.

The first auxiliary extension portion AX_E1 and the auxiliary electrode AXE of the embodiment of FIGS. 3 to 5 described above may be formed in a substantially same manner. For example, the first auxiliary extension portion AX_E1 may be disposed to extend in the second direction DR2 between the sub-pixels SPXn. The first auxiliary extension portion AX_E1 may be disposed to overlap the first bank pattern BP1 and the bank layer BNL in the third direction DR3, and may be disposed so as not to overlap the light emitting area EMA and the sub-area SA. The first branch portion AX_C1 may branch from the first auxiliary extension portion AX_E1 in the first direction DR1 to extend to the light emitting area EMA. The first branch portion AX_C1 may be disposed to overlap the second isolation portion ROP2 disposed in the light emitting area EMA of the first sub-pixel SPX1 in the third direction DR3. The first branch portion AX_C1 may be disposed so as not to overlap each of the electrodes RME1 to RME8 in the third direction DR3, and to overlap the third connection electrode CNE3 and the fifth connection electrode CNE5. The first branch portion AX_C1 may be disposed so as not to overlap the first bank pattern BP1 and to partially overlap the bank layer BNL.

The second branch portion AX_C2 and the third branch portion AX_C3 may branch from the first auxiliary extension portion AX_E1 in a direction opposite to the first direction DR1 to extend to the light emitting area EMA of the adjacent sub-pixel SPXn. The second branch portion AX_C2 and the third branch portion AX_C3 may be disposed to be spaced apart from each other in the second direction DR2. Since the second branch portion AX_C2 and the third branch portion AX_C3 of the first auxiliary electrode AXE1 and a fifth branch portion AX_C5 and a sixth branch portion AX_C6 of the second auxiliary electrode AXE2 to be described below have a substantially same structure, the second branch portion AX_C2 and the third branch portion AX_C3 will be described in detail in a description of the fifth branch portion AX_C5 and the sixth branch portion AX_C6.

The second auxiliary electrode AXE2 may include a second auxiliary extension portion AX_E2 extending in the second direction DR2, a fourth branch portion AX_C4 branched from the second auxiliary extension portion AX_E2 in the first direction DR1, and a fifth branch portion AX_C5 and a sixth branch portion AX_C6 branched from the second auxiliary extension portion AX_E2 in the direction opposite to the first direction DR1. The second auxiliary extension portion AX_E2 and the first auxiliary extension portion AX_E1 of the first auxiliary electrode AXE1 described above may have different positions but have a substantially same structure. For example, the second auxiliary extension portion AX_E2 may be disposed between the sub-pixels SPXn to extend in the second direction DR2. The second auxiliary extension portion AX_E2 may be disposed to overlap the first bank pattern BP1 and the bank layer BNL in the third direction DR3, and may be disposed so as not to overlap the light emitting area EMA and the sub-area SA.

The fourth branch portion AX_C4 may branch from the second auxiliary extension portion AX_E2 in the first direction DR1 to extend to the light emitting area EMA of the adjacent sub-pixel SPXn. The fourth branch portion AX_C4 may be disposed to overlap in the third direction DR3 the second isolation portion ROP2 disposed in the light emitting area EMA of the second sub-pixel adjacent to the first sub-pixel SPX1 in the first direction DR1. The fourth branch portion AX_C4 and the first branch portion AX_C1 of the first auxiliary electrode AXE1 described above may have different positions but have a substantially same structure. For example, the fourth branch portion AX_C4 may be disposed so as not to overlap each of the electrodes RME1 to RME8 of the sub-pixel SPXn adjacent to each other in the third direction DR3, and to overlap the third connection electrode CNE3 and the fifth connection electrode CNE5. The fourth branch portion AX_C4 may be disposed so as not to overlap the first bank pattern BP1 and to partially overlap the bank layer BNL.

The fifth branch portion AX_C5 and the sixth branch portion AX_C6 may branch from the second auxiliary extension portion AX_E2 in the direction opposite to the first direction DR1 to extend to the light emitting area EMA of the first sub-pixel SPX1. The fifth branch portion AX_C5 and the sixth branch portion AX_C6 may be disposed to be spaced apart from each other in the second direction DR2, and may be disposed to be spaced apart from each other with the first branch portion AX_C1 of the first auxiliary electrode AXE1 interposed therebetween. The fifth branch part portion AX_C5 may be disposed at an upper side of the light emitting area EMA of the first sub-pixel SPX1, and the sixth branch portion AX_C6 may be disposed at a lower side of the light emitting area EMA of the first sub-pixel SPX1. The fifth branch portion AX_C5 and the sixth branch portion AX_C6 may overlap the first bank pattern BP1, the second bank pattern BP2, and the bank layer BNL in the third direction DR3, respectively. The fifth branch portion AX_C5 may overlap the first to fourth electrodes RME1 to RME4, and the sixth branch portion AX_C6 may be disposed to overlap the fifth to eighth electrodes RME5 to RME8. The second branch portion AX_C2 and the third branch portion AX_C3 of the first auxiliary electrode AXE1 that are not described above and the fifth branch portion AX_C5 and sixth branch portion AX_C6 described above may have a substantially same arrangement.

The first branch portion AX_C1 of the first auxiliary electrode AXE1, and the fifth branch portion AX_C5 and the sixth branch portion AX_C6 of the second auxiliary electrode AXE2 may extend to the light emitting area EMA disposed between the first auxiliary electrode AXE1 and the second auxiliary electrode AXE2. In the light emitting area EMA, the fifth branch portion AX_C5 and the sixth branch portion AX_C6 of the second auxiliary electrode AXE2 may be disposed to be spaced apart from each other in the second direction DR2 with the first branch portion AX_C1 of the first auxiliary electrode AXE1 interposed therebetween.

The second branch portion AX_C2 and the third branch portion AX_C3 of the first auxiliary electrode AXE1 may extend from the light emitting area EMA to a light emitting area EMA of another adjacent sub-pixel SPXn in a direction opposite to the first direction DR1. The fourth branch portion AX_C4 of the second auxiliary electrode AXE2 may extend from the light emitting area EMA to a light emitting area EMA of another adjacent sub-pixel SPXn in the first direction DR1.

According to an embodiment, the first auxiliary electrode AXE1 and the second auxiliary electrode AXE2 may be disposed so as not to overlap each of the light emitting elements ED. For example, the first auxiliary extension portion AX_E1 of the first auxiliary electrode AXE1 and the second auxiliary extension portion AX_E2 of the second auxiliary electrode AXE2 may be disposed so as not to overlap the light emitting area EMA in which the light emitting elements ED are disposed, and the first branch portion AX_C1 of the first auxiliary electrode AXE1, and the fifth branch portion AX_C5 and the sixth branch portion AX_C6 of the second auxiliary electrode AXE2 extended to the light emitting area EMA of the sub-pixel SPXn may be disposed to overlap the light emitting area EMA but so as not to overlap the light emitting elements ED.

The first auxiliary electrode AXE1 and second auxiliary electrode AXE2 described above may be disposed on a first via layer VIA1. The first via layer VIA1 may correspond to the via layer VIA in the embodiment of FIG. 5. In the embodiment, a second via layer VIA2 may be disposed on the first auxiliary electrode AXE1 and second auxiliary electrode AXE2. The second via layer VIA2 may serve to insulate the first auxiliary electrode AXE1 and the second auxiliary electrode AXE2 from other electrodes, for example, the third connection electrode CNE3 and the fifth connection electrode CNE5 overlapping each other in the second isolation portion ROP2. The second via layer VIA2 and the first via layer VIA1 may be formed of (or include) a substantially same material.

In an embodiment, the first auxiliary electrode AXE1 and the second auxiliary electrode AXE2 may be electrodes to which an alternating current (AC) signal is applied. As will be described below, in case that the AC signal is applied to the auxiliary electrode AXE after ink including the light emitting element ED is sprayed onto the substrate SUB, a flow of ink may be caused by an AC electroosmosis (ACEO)

phenomenon to move the light emitting element ED on the bank layer BNL to the light emitting area EMA. In the embodiment, by forming the first auxiliary electrode AXE1 and the second auxiliary electrode AXE2 so that the light emitting elements ED are not disposed on the second isolation portion ROP2 disposed at the center of the light emitting area EMA and the upper side and the lower side of the light emitting area EMA, the light emitting elements ED may be moved to the light emitting area EMA. Accordingly, a luminance of the sub-pixel SPXn may be improved by disposing the light emitting elements ED that do not emit light in the light emitting area EMA.

Hereinafter, a method for manufacturing the display device according to the above-described embodiment will be described.

FIGS. 11 to 15 are schematic views illustrating a method for manufacturing a display device according to an embodiment for each process. FIGS. 11 to 15 sequentially illustrate a process of aligning light emitting elements on a substrate.

Figure 11:
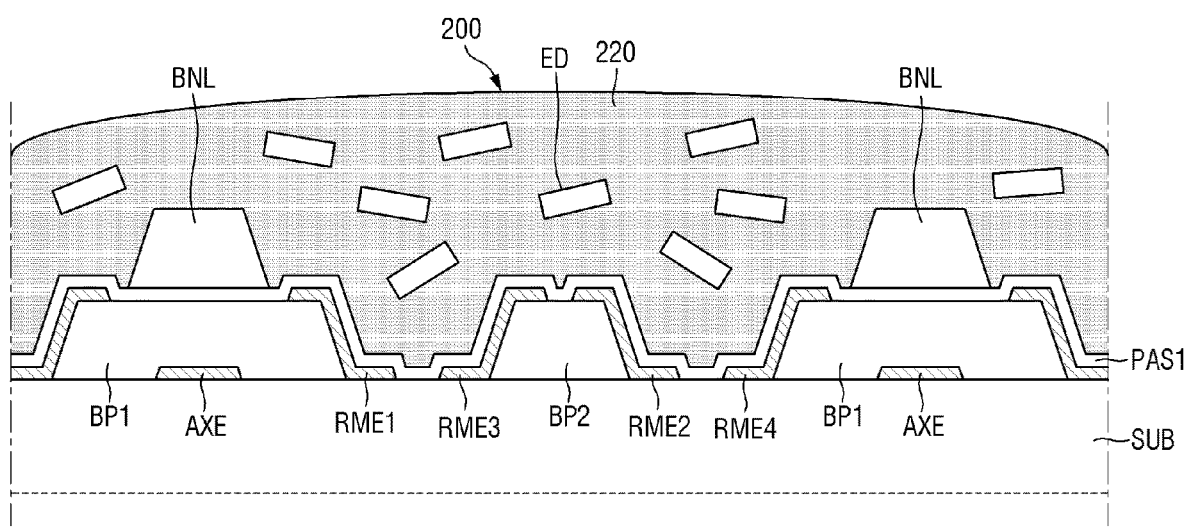
FIGS. 11 to 15 are schematic views illustrating a method for manufacturing a display device according to an embodiment for each process.

Referring to FIG. 11, a substrate SUB on which an auxiliary electrode AXE, a first bank pattern BP1, a second bank pattern BP2, the respective electrodes RME1, RME2, RME3, and RME4, a first insulating layer PAS1, and a bank layer BNL are formed is prepared. Light emitting element ink 200 including light emitting elements ED and a solvent (or light emitting element solvent; hereinafter, "light emitting element solvent") 220 is prepared. Although FIG. 11 illustrates that four electrodes are disposed on the substrate SUB, a larger number or smaller number of electrodes may be disposed on the substrate SUB. The substrate SUB may include circuit elements disposed thereon in addition to the substrate SUB of the display device 10 described above. Hereinafter, illustration of the circuit elements is omitted for convenience of description.

The light emitting element ink 200 may include the light emitting element solvent 220 and the light emitting elements ED dispersed therein. The light emitting element ink 200 may be prepared through a dispersion process of mixing the light emitting elements ED and the light emitting element solvent 220. In the dispersion process, the light emitting elements ED are mixed with the light emitting element solvent 220, which is performed through a mixing process of 5 minutes or more. The light emitting elements ED may be included in 0.01 to 10 parts by weight based on total 100 parts by weight of the light emitting element ink 200. The mixing process may be performed by a sonication process, a stirring process, a milling process, or the like.

The light emitting element ink 200 is sprayed on the electrodes RME1, RME2, RME3, and RME4 on the substrate SUB. In an embodiment, the light emitting element ink 200 may be sprayed through a printing process using an inkjet printing apparatus. The light emitting element ink 200 may be sprayed through a nozzle of an inkjet head included in the inkjet printing apparatus. The light emitting element ink 200 may be discharged onto the substrate SUB through the nozzle provided in the inkjet head. The light emitting element ink 200 discharged from the nozzle may be seated on the electrodes RME1, RME2, RME3, and RME4 disposed on the substrate SUB. The light emitting element ED may have a shape extending in a direction, and may be dispersed in a state in which an extending direction is a random orientation direction in the light emitting element ink 200.

Figure 12:
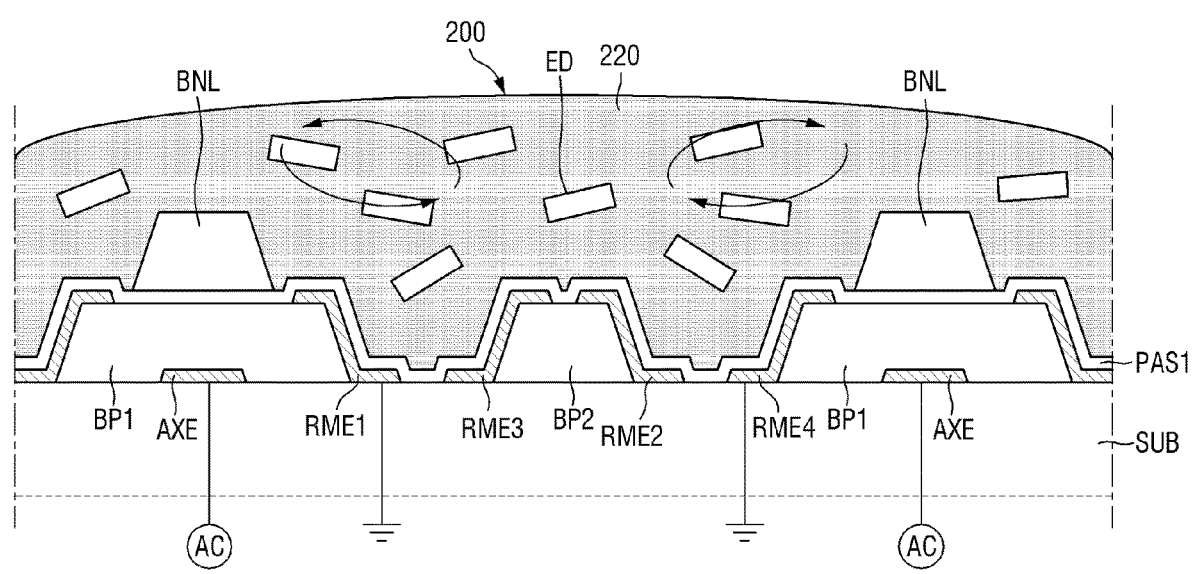
Figure 13:
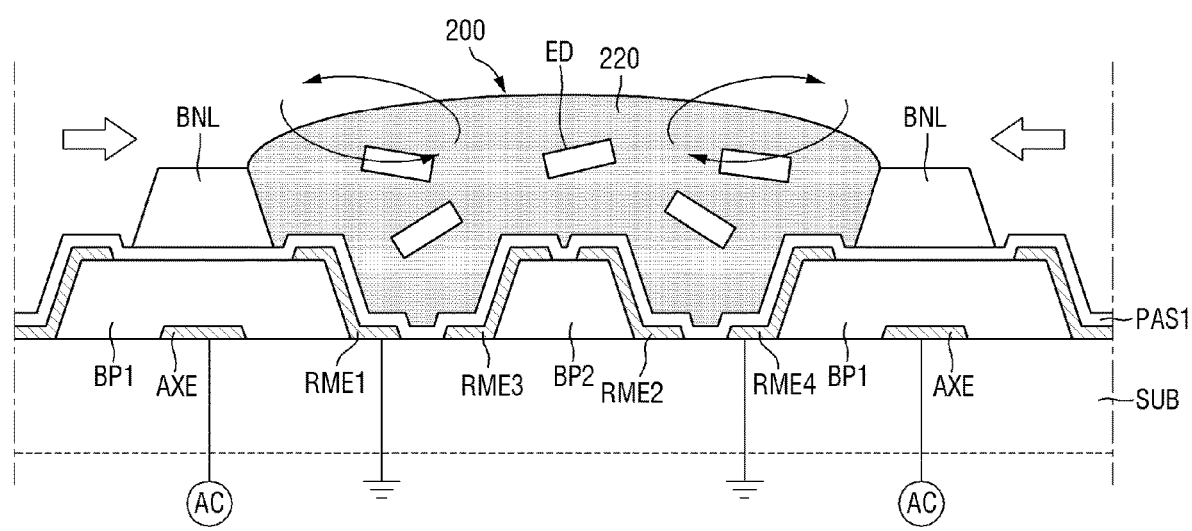

Referring to FIGS. 12 and 13, an AC electroosmosis is generated in the light emitting element ink 200 by applying the alternating current (AC) signal to the auxiliary electrode AXE while performing a primary drying process. The drying process, which is a process of irradiating the substrate SUB with heat, may be performed in a chamber in which internal pressure may be adjusted. According to an embodiment, the drying process may be performed in a temperature range of about 100° C. to about 400° C. at a pressure of about $10^{-4}$ Torr to about 1 Torr. In case that a heat treatment process is performed within the pressure range, a boiling point of the light emitting element solvent 220 itself is also lowered, so that the light emitting element solvent 220 may be dried more easily. The heat treatment process performed in the chamber may be performed for about 1 minute to about 30 minutes. However, the disclosure is not limited thereto.

An alternating current (AC) signal is applied to the auxiliary electrode AXE, and electrodes adjacent to the auxiliary electrode AXE, for example, the first electrode RME1 and the fourth electrode RME4 are maintained in a ground state. In case that the AC signal is applied to the auxiliary electrode AXE, a flow occurs in the light emitting element ink due to an AC electroosmosis phenomenon. The electroosmosis phenomenon may cause a fluid to flow in a direction in which an electric field is strong. The flow of the light emitting element ink 200 occurs from an upper portion of the auxiliary electrode AXE to a periphery, and due to such a flow, the light emitting elements ED move from the upper portion of the auxiliary electrode AXE to the periphery. For example, the flow of the light emitting element ink 200 may swirl in a peripheral direction from an upper portion of the bank layer BNL overlapping the auxiliary electrode AXE, and such a swirl may move the light emitting elements ED existing on the bank layer BNL to the light emitting area EMA.

As illustrated in FIG. 13, a volume of the light emitting element ink 200 is reduced by the drying process of the light emitting element ink 200, and the light emitting elements ED are gathered onto upper portions of the electrodes RME1, RME2, RME3, and RME4. Next, the AC signal applied to the auxiliary electrode AXE is stopped.

Figure 14:
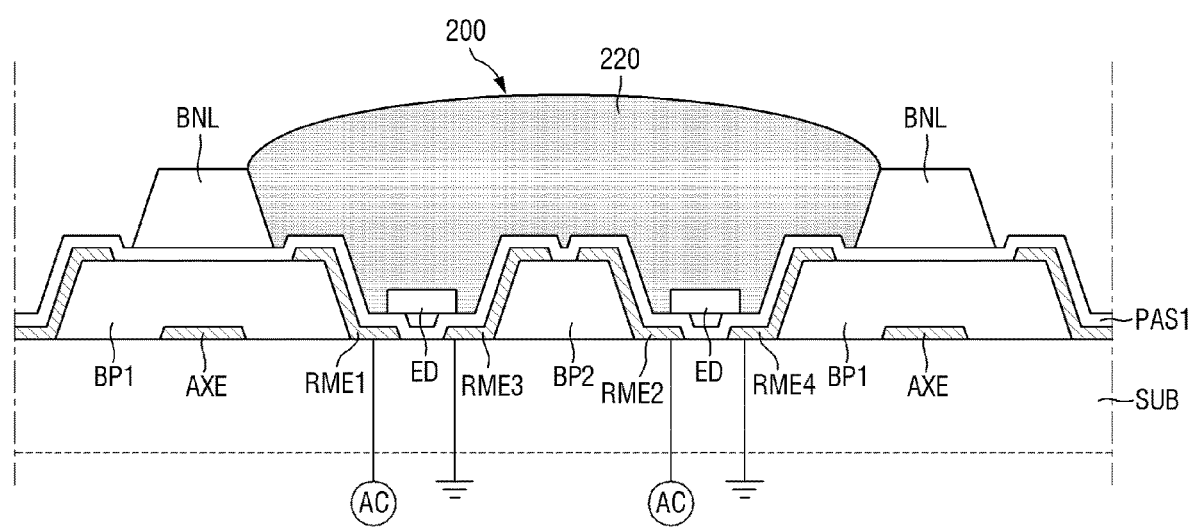

Referring to FIG. 14, the light emitting elements ED are aligned by applying an alignment signal to the first electrode RME1 and the second electrode RME2. An electric field is generated on the electrodes RME1, RME2, RME3, and RME4 by applying the alternating current (AC) signal to the first electrode RME1 and the second electrode RME2. The light emitting elements ED dispersed in the light emitting element solvent 220 of the light emitting element ink 200 may be applied with a dielectrophoretic force by the electric field, and may be disposed on the electrodes RME1, RME2, RME3, and RME4 while positions thereof are changed.

In case that the electric field is generated by applying the AC electric signal to the first electrode RME1 and the second electrode RME2, the light emitting elements ED may be applied with the dielectrophoretic force. Dielectrophoresis may also control movement of non-charged particles. In case that an AC electric field is applied to a dielectric, an induced dipole is generated in the dielectric and a net force is induced in a direction in which a density of the electric field is high, so that movement of the dielectric may be controlled. In case that the electric field generated on the electrodes RME1, RME2, RME3, and RME4 is generated on a top surface of the substrate SUB, the light emitting elements ED may move toward the electrodes RME1, RME2, RME3, and RME4 from initially dispersed positions thereof by the dielectrophoretic force. The light emitting elements ED may be aligned and disposed on the electrodes RME1, RME2, RME3, and RME4 while the positions thereof are changed by the electric field.

Figure 15:
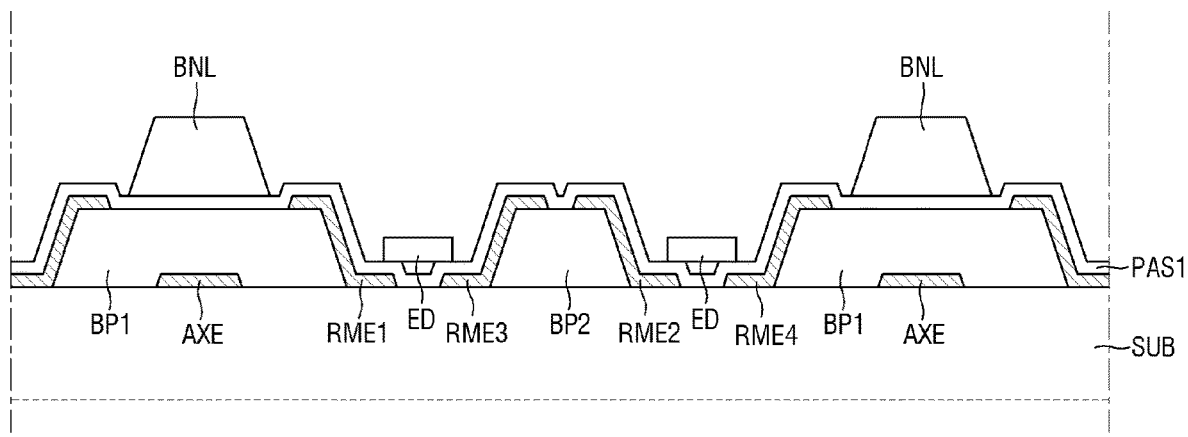

Referring to FIG. 15, after the light emitting elements ED are aligned, a secondary drying process of removing the light emitting element solvent 220 by irradiating the light emitting element ink 200 with heat is performed. The secondary drying process and the primary drying process described above may be performed under same conditions. However, the disclosure is not limited thereto, and the secondary drying process may be performed at a higher temperature and for a longer period of time than the primary drying process.

As illustrated in FIG. 5 described above, the display device may be manufactured by forming insulating layers and connection electrodes.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a light emitting area and a sub-area spaced apart from each other;
a first electrode and a second electrode disposed on a substrate and spaced apart from each other;
a first insulating layer disposed on the first electrode and the second electrode;
a bank layer disposed on the first insulating layer and disposed between the light emitting area and the sub-area;
light emitting elements disposed on the first electrode and the second electrode;
a first connection electrode electrically connected to an end of the light emitting element and a second connection electrode connected to another end of the light emitting element; and
auxiliary electrodes disposed between the substrate and the bank layer and spaced apart from each other with the light emitting area and the sub-area disposed between the auxiliary electrodes, the auxiliary electrodes do not overlap the first and second electrodes.

2. The display device of claim 1, wherein the auxiliary electrodes overlap the bank layer in a plan view and do not overlap the light emitting area and the sub-area in a plan view.

3. The display device of claim 1, wherein the auxiliary electrodes extend parallel to the first electrode and the second electrode and are spaced apart from the first electrode and the second electrode.

4. The display device of claim 1, further comprising:
first bank patterns disposed between the substrate and the bank layer,
wherein the auxiliary electrodes are disposed between the first bank patterns and the substrate.

5. The display device of claim 4, wherein the auxiliary electrodes are covered by the first bank patterns.

6. The display device of claim 1, wherein
the auxiliary electrodes include a first auxiliary electrode and a second auxiliary electrode spaced apart from each other, and
the first auxiliary electrode and the second auxiliary electrode are spaced apart from each other with the light emitting area disposed between the first and second auxiliary electrodes.

7. The display device of claim 6, wherein
the first auxiliary electrode includes:
a first auxiliary extension portion extending parallel to the first electrode;
a first branch portion branched from the first auxiliary extension portion in a first direction; and
a second branch portion and a third branch portion branched from the first auxiliary extension portion in a direction opposite to the first direction, the second and third branch portions spaced apart from each other, and
the second auxiliary electrode includes:
a second auxiliary extension portion extending parallel to the first electrode;
a fourth branch portion branched from the second auxiliary extension portion in the first direction; and
a fifth branch portion and a sixth branch portion branched from the second auxiliary extension portion in the direction opposite to the first direction, the fifth and sixth branch portions spaced apart from each other.

8. The display device of claim 7, wherein
the first branch portion, the fifth branch portion, and the sixth branch portion extend to the light emitting area disposed between the first auxiliary electrode and the second auxiliary electrode, and
the fifth branch portion and the sixth branch portion are spaced apart from each other with the first branch portion disposed between the fifth and sixth branch portions.

9. The display device of claim 7, wherein
the second branch portion and the third branch portion extend from the light emitting area to another light emitting area adjacent in the direction opposite to the first direction, and
the fourth branch portion extends from the light emitting area to another light emitting area adjacent in the first direction.

10. The display device of claim 7, wherein
the first branch portion does not overlap the first electrode and the second electrode in a plan view, and
the fifth branch portion overlaps the first electrode and the second electrode in a plan view.

11. The display device of claim 7, further comprising:
a first via layer disposed on the substrate;
a second via layer disposed on the first via layer; and
first bank patterns disposed on the second via layer and spaced apart from each other.

12. The display device of claim 11, wherein
the first auxiliary electrode and the second auxiliary electrode are disposed between the first via layer and the second via layer, and
the first electrode and the second electrode are disposed on the second via layer.

13. The display device of claim 11, wherein
the first branch portion does not overlap the first bank patterns in a plan view, and
the fifth branch portion and the sixth branch portion overlap the first bank patterns in a plan view.

14. The display device of claim 7, wherein the first auxiliary electrode and the second auxiliary electrode have a substantially same shape in a plan view.

15. The display device of claim 7, wherein the first branch portion, the fifth branch portion, and the sixth branch portion overlap the light emitting area and do not overlap the light emitting elements in a plan view.

16. A method for manufacturing a display device, the method comprising:
preparing, on a substrate, auxiliary electrodes spaced apart from each other, first and second electrodes spaced apart from each other and spaced apart from the auxiliary electrodes, and a bank layer disposed on the auxiliary electrodes;
providing light emitting element ink including light emitting elements onto the substrate;
applying an alternating current (AC) signal to the auxiliary electrodes; and
aligning the light emitting elements by applying an alignment signal to the first electrode and the second electrode.

17. The method of claim 16, wherein the AC signal applied to the auxiliary electrodes is a signal of about 50 Hz or less.

18. The method of claim 16, wherein in case that the AC signal is applied to the auxiliary electrodes, a flow of the light emitting element ink is generated by an AC electroosmosis phenomenon.

19. The method of claim 16, further comprising:
performing a drying process of drying the light emitting element ink and the applying of the AC signal to the auxiliary electrodes at a substantially same time.

20. The method of claim 16, further comprising:
performing a drying process of drying and removing the light emitting element ink after the light emitting elements are aligned.

21. An electronic device comprising:
a light emitting area and a sub-area spaced apart from each other;
a first electrode and a second electrode disposed on a substrate and spaced apart from each other;
a first insulating layer disposed on the first electrode and the second electrode;
a bank layer disposed on the first insulating layer and disposed between the light emitting area and the sub-area;
light emitting elements disposed on the first electrode and the second electrode;
a first connection electrode electrically connected to an end of the light emitting element and a second connection electrode connected to another end of the light emitting element; and
auxiliary electrodes disposed between the substrate and the bank layer and spaced apart from each other with the light emitting area and the sub-area disposed between the auxiliary electrodes, the auxiliary electrodes do not overlap the first and second electrodes.

* * * * *